United States Patent
Funk et al.

(10) Patent No.: US 9,441,782 B2
(45) Date of Patent: Sep. 13, 2016

(54) TABLET MOUNTING ARM SYSTEMS AND METHODS

(71) Applicant: Ergotron, Inc., St. Paul, MN (US)

(72) Inventors: Joe Funk, Rosemount, MN (US); Shaun C. Lindblad, Lino Lakes, MN (US); Mustafa A. Ergun, Plymouth, MN (US)

(73) Assignee: Ergotron, Inc., St. Paul, MN (US)

( * ) Notice: Subject to any disclaimer, the term of this patent is extended or adjusted under 35 U.S.C. 154(b) by 74 days.

(21) Appl. No.: 13/650,702

(22) Filed: Oct. 12, 2012

(65) Prior Publication Data

US 2013/0092805 A1    Apr. 18, 2013

Related U.S. Application Data

(60) Provisional application No. 61/547,257, filed on Oct. 14, 2011, provisional application No. 61/553,620, filed on Oct. 31, 2011, provisional application No. 61/583,847, filed on Jan. 6, 2012, provisional application No. 61/590,032, filed on Jan. 24, 2012.

(51) Int. Cl.
*E04G 3/00* (2006.01)
*G06F 1/16* (2006.01)
(Continued)

(52) U.S. Cl.
CPC ............. *F16M 13/02* (2013.01); *F16M 13/00* (2013.01); *F16M 13/022* (2013.01);
(Continued)

(58) Field of Classification Search
CPC .... F16M 13/00; F16M 11/041; F16M 11/10; F16M 13/022; F16M 11/04; F16M 111/2064; F16M 13/02; Y10S 248/917; Y10S 248/918; Y10S 248/92; Y10S 248/923; G06F 1/1632; G06F 1/1607; G06F 1/1654; G06F 1/1647; G06F 1/1649

USPC ............ 248/121, 278.1, 279.1, 280.1, 286.1, 248/298.1, 299.1, 442.2, 918; 361/679.04, 361/679.05, 679.06
See application file for complete search history.

(56) References Cited

U.S. PATENT DOCUMENTS

| 4,683,424 A | 7/1987 | Cutright et al. |
| 4,720,048 A | 1/1988 | Maroney et al. |

(Continued)

FOREIGN PATENT DOCUMENTS

| EP | 0997399 A2 | 5/2000 |
| EP | 2045689 | 4/2009 |

(Continued)

OTHER PUBLICATIONS

"U.S. Appl. No. 13/025,782, Non Final Office Action mailed Oct. 9, 2012", 11 pgs.

(Continued)

*Primary Examiner* — Syed A Islam
*Assistant Examiner* — Taylor Morris
(74) *Attorney, Agent, or Firm* — Schwegman Lundberg & Woessner, P.A.

(57) ABSTRACT

One embodiment provides a tablet mounting system including a support having a tablet portion located near the first end of the support arm for supporting a tablet, a monitor portion located between the tablet portion and the second end of the support arm for supporting a display monitor, and a support portion located between the first end and the second end of the support arm for attaching the arm to a support object such as a desk, wall, desk stand, or display arm. In some cases, the support portion is located closer to the monitor portion of the support arm than to the tablet portion of the support arm. A tablet mount is configured to support a tablet and to attached to the tablet portion of the support arm. Methods for mounting tablets are also provided.

19 Claims, 17 Drawing Sheets

(51) Int. Cl.

| | | |
|---|---|---|
| F16M 13/02 | (2006.01) | |
| F16M 13/00 | (2006.01) | |
| H05K 5/02 | (2006.01) | |
| F16L 13/00 | (2006.01) | |
| B41J 11/02 | (2006.01) | |
| A47B 97/04 | (2006.01) | |
| A47B 97/06 | (2006.01) | |
| H05K 5/00 | (2006.01) | |
| H05K 7/00 | (2006.01) | |

(52) U.S. Cl.
CPC .......... *G06F 1/1607* (2013.01); *G06F 1/1626* (2013.01); *G06F 1/1632* (2013.01); *H05K 5/0204* (2013.01); *G06F 1/1647* (2013.01); *G06F 1/1649* (2013.01); *G06F 1/1654* (2013.01); *Y10T 29/49817* (2015.01); *Y10T 29/49826* (2015.01); *Y10T 29/49948* (2015.01)

(56) References Cited

U.S. PATENT DOCUMENTS

| | | | |
|---|---|---|---|
| 4,922,721 | A | 5/1990 | Robertson et al. |
| 5,301,346 | A | 4/1994 | Notarianni et al. |
| 5,436,792 | A | 7/1995 | Leman et al. |
| 5,457,745 | A | 10/1995 | Wang |
| 5,513,066 | A | 4/1996 | Berman |
| 5,528,453 | A | 6/1996 | Berman et al. |
| 5,621,890 | A | 4/1997 | Notarianni et al. |
| 5,899,421 | A | 5/1999 | Silverman |
| 6,008,621 | A | 12/1999 | Madison et al. |
| 6,189,849 | B1 | 2/2001 | Sweere |
| 6,218,796 | B1 | 4/2001 | Kozlowski |
| D450,903 | S | 11/2001 | Wacker et al. |
| 6,336,691 | B1 | 1/2002 | Maroney et al. |
| 6,434,512 | B1 | 8/2002 | Discenzo |
| 6,480,391 | B1 | 11/2002 | Monson et al. |
| 6,667,877 | B2 * | 12/2003 | Duquette ................. 361/679.04 |
| 6,783,105 | B2 | 8/2004 | Oddsen, Jr. |
| 6,796,844 | B1 | 9/2004 | Edwards, III |
| 6,967,632 | B1 * | 11/2005 | Minami et al. ................. 345/1.3 |
| 7,028,966 | B2 * | 4/2006 | Bauman et al. ............ 248/442.2 |
| 7,055,833 | B2 | 6/2006 | Wixted et al. |
| 7,130,190 | B1 | 10/2006 | Baker |
| 7,160,113 | B2 | 1/2007 | McConnell |
| 7,238,042 | B2 | 7/2007 | Chen et al. |
| 7,252,277 | B2 | 8/2007 | Sweere |
| 7,274,564 | B2 * | 9/2007 | Rossini .................... 361/679.41 |
| 7,325,891 | B1 | 2/2008 | Kinsley et al. |
| 7,537,190 | B2 | 5/2009 | Fan |
| 7,551,458 | B2 | 6/2009 | Carnevali |
| 7,595,995 | B2 | 9/2009 | Hock |
| 7,643,291 | B2 | 1/2010 | Mallia et al. |
| 7,679,902 | B2 | 3/2010 | Thompson |
| 7,800,914 | B2 | 9/2010 | Dully |
| 7,813,118 | B2 * | 10/2010 | Burge ...................... 361/679.41 |
| 7,845,608 | B1 | 12/2010 | Chen et al. |
| 7,887,014 | B2 | 2/2011 | Lindblad |
| 7,984,886 | B2 | 7/2011 | Lin |
| 8,047,383 | B2 | 11/2011 | Hendrix et al. |
| 8,066,242 | B2 | 11/2011 | Potter et al. |
| 8,074,951 | B2 | 12/2011 | Carnevali |
| 8,240,628 | B2 | 8/2012 | Huang |
| 8,243,455 | B1 | 8/2012 | Raymond et al. |
| 8,320,110 | B2 | 11/2012 | Chen |
| 8,422,206 | B2 | 4/2013 | Fu et al. |
| 8,469,325 | B2 | 6/2013 | Yu |
| 8,503,182 | B2 | 8/2013 | Petrick |
| 8,752,848 | B2 | 6/2014 | Petrick et al. |
| 8,811,007 | B2 | 8/2014 | Zhou |
| 8,833,716 | B2 | 9/2014 | Funk et al. |
| 9,030,828 | B2 | 5/2015 | Lindblad et al. |
| 9,163,779 | B2 | 10/2015 | Funk et al. |
| 2003/0001055 | A1 * | 1/2003 | Harary et al. ............ 248/221.11 |
| 2003/0021091 | A1 | 1/2003 | Robbins et al. |
| 2003/0111245 | A1 | 6/2003 | Haggerty |
| 2003/0141687 | A1 | 7/2003 | Wixted et al. |
| 2003/0222848 | A1 | 12/2003 | Solomon |
| 2003/0227753 | A1 | 12/2003 | Wrycraft |
| 2003/0235029 | A1 | 12/2003 | Doherty et al. |
| 2004/0058704 | A1 | 3/2004 | Peiker |
| 2004/0139571 | A1 | 7/2004 | Chang et al. |
| 2004/0240167 | A1 | 12/2004 | Ledbetter |
| 2004/0257753 | A1 | 12/2004 | Rossini |
| 2005/0030706 | A1 | 2/2005 | Kim |
| 2005/0110461 | A1 | 5/2005 | Mcconnell et al. |
| 2006/0274495 | A1 | 12/2006 | Nakamura |
| 2007/0002533 | A1 | 1/2007 | Kogan et al. |
| 2007/0049071 | A1 | 3/2007 | Jackson et al. |
| 2007/0058344 | A1 | 3/2007 | Baker |
| 2007/0084978 | A1 | 4/2007 | Martin |
| 2007/0168593 | A1 | 7/2007 | Montag et al. |
| 2007/0259554 | A1 | 11/2007 | Lindblad |
| 2008/0106870 | A1 | 5/2008 | Dully |
| 2008/0117578 | A1 * | 5/2008 | Moscovitch ................. 361/681 |
| 2008/0225472 | A1 * | 9/2008 | Chih ............................ 361/681 |
| 2009/0016008 | A1 | 1/2009 | Hock |
| 2009/0090825 | A1 * | 4/2009 | Jung et al. ................. 248/205.1 |
| 2009/0096336 | A1 | 4/2009 | Petrick et al. |
| 2009/0122474 | A1 * | 5/2009 | Mickey et al. .......... 361/679.04 |
| 2009/0134285 | A1 * | 5/2009 | Huang ....................... 248/124.1 |
| 2009/0146911 | A1 | 6/2009 | Kang |
| 2009/0240370 | A1 | 9/2009 | Nichols et al. |
| 2009/0267772 | A1 | 10/2009 | Dehnadi |
| 2009/0270727 | A1 | 10/2009 | Zhao et al. |
| 2010/0176254 | A1 | 7/2010 | Sweere et al. |
| 2011/0193524 | A1 | 8/2011 | Hazzard et al. |
| 2011/0240830 | A1 | 10/2011 | Alemozafar et al. |
| 2011/0264927 | A1 | 10/2011 | Dearborn et al. |
| 2011/0266930 | A1 | 11/2011 | Petrick et al. |
| 2011/0267782 | A1 | 11/2011 | Petrick et al. |
| 2011/0309591 | A1 | 12/2011 | Petrick et al. |
| 2012/0087074 | A1 | 4/2012 | Chen |
| 2012/0119040 | A1 | 5/2012 | Ergun et al. |
| 2012/0173033 | A1 | 7/2012 | Tischer |
| 2012/0187056 | A1 | 7/2012 | Hazzard |
| 2012/0206867 | A1 | 8/2012 | Pence |
| 2012/0223676 | A1 | 9/2012 | Petrick et al. |
| 2013/0050932 | A1 | 2/2013 | Williams |
| 2013/0092811 | A1 | 4/2013 | Funk |
| 2013/0200584 | A1 | 8/2013 | Guasta |
| 2013/0262248 | A1 | 10/2013 | Kim et al. |
| 2013/0277520 | A1 | 10/2013 | Funk et al. |
| 2013/0277930 | A1 | 10/2013 | Ergun et al. |
| 2013/0279106 | A1 | 10/2013 | Ergun et al. |
| 2013/0279109 | A1 | 10/2013 | Lindblad et al. |
| 2015/0192968 | A1 | 7/2015 | Lindblad et al. |

FOREIGN PATENT DOCUMENTS

| | | |
|---|---|---|
| EP | 2766784 A1 | 8/2014 |
| WO | WO-0177799 A1 | 10/2001 |
| WO | WO-2011017757 A1 | 2/2011 |
| WO | WO-2013056025 A1 | 4/2013 |
| WO | WO-2013056029 | 4/2013 |

OTHER PUBLICATIONS

"U.S. Appl. No. 13/650,616, Non Final Office Action mailed Jan. 28, 2014", 15 pgs.

"U.S. Appl. No. 13/650,631, Non Final Office Action mailed Oct. 9, 2013", 11 pgs.

"U.S. Appl. No. 13/650,631, Response filed Feb. 7, 2014 to Non Final Office Action mailed Oct. 9, 2013", 11 pgs.

"U.S. Appl. No. 13/650,631, Response filed Sep. 26, 2013 to Restriction Requirement mailed Aug. 29, 2013", 2 pgs.

"U.S. Appl. No. 13/650,631, Restriction Requirement mailed Aug. 29, 2013", 6 pgs.

"International Application Serial No. PCT/US2011/024534, International Search Report mailed Apr. 15, 2011", 2 pgs.

"International Application Serial No. PCT/US2011/024534, Written Opinion mailed Apr. 15, 2011", 8 pgs.

(56) References Cited

OTHER PUBLICATIONS

"International Application Serial No. PCT/US2012/059922, International Search Report mailed Feb. 4, 2013", 3 pgs.
"International Application Serial No. PCT/US2012/059922, Written Opinion mailed Feb. 4, 2013", 5 pgs.
"International Application Serial No. PCT/US2012/059926, International Search Report mailed Feb. 8, 2013", 3 pgs.
"International Application Serial No. PCT/US2012/059926, Written Opinion mailed Feb. 8, 2013", 6 gs.
"International Application Serial No. PCT/US2012/060042, International Search Report mailed Jan. 30, 2013", 4 pgs.
"International Application Serial No. PCT/US2012/060042, Written Opinion mailed Jan. 30, 2013", 6 pgs.
"International Application Serial No. PCT/US2012/060049, International Search Report mailed Feb. 19, 2013", 4 pgs.
"International Application Serial No. PCT/US2012/060049, Written Opinion mailed Feb. 19, 2013", 7 pgs.
"U.S. Appl. No. 13/650,572, Non Final Office Action mailed May 12, 2014", 10 pgs.
"U.S. Appl. No. 13/650,616, Response filed Jun. 24, 2014 to Restriction Requirement mailed Apr. 29, 2014", 5 pgs.
"U.S. Appl. No. 13/650,616, Restriction Requirement mailed Apr. 29, 2014", 6 pgs.
"U.S. Appl. No. 13/650,631, Notice of Allowance mailed May 21, 2014", 8 pgs.
"U.S. Appl. No. 13/651,066, Non Final Office Action mailed Jul. 15, 2014", 11 pgs.
"U.S. Appl. No. 13/651,066, Response filed Jun. 24, 2014 to Restriction Requirement mailed May 27, 2014", 7 pgs.
"U.S. Appl. No. 13/651,066, Restriction Requirement mailed May 27, 2014", 6 pgs.
"International Application Serial No. PCT/US2012/059922, International Preliminary Report on Patentability mailed Apr. 24, 2014", 6 pgs.
"International Application Serial No. PCT/US2012/059926, International Preliminary Report on Patentability mailed Apr. 24, 2014", 7 pgs.
"International Application Serial No. PCT/US2012/060053, International Preliminary Report on Patentability mailed Apr. 24, 2014", 7 pgs.
"International Application Serial No. PCT/US2012/060056, International Preliminary Report on Patentability mailed Apr. 24, 2014", 7 pgs.
International Search Report and Written Opinion, dated Feb. 25, 2013 for PCT Application No. PCT/US2012/060053, 9 pages.
Ergotron® WorkFit C-Mod, Combo, Product Sheet, Aug. 10, 2009, 1 page.
International Search Report and Written Opinion, dated Feb. 22, 2013 for PCT Application No. PCT/US2012/060056, 8 pages.
"U.S. Appl. No. 13/650,572, Notice of Allowance mailed Sep. 16, 2014", 8 pgs.
"U.S. Appl. No. 13/650,572, Response filed Aug. 12, 2014 to Non Final Office Action mailed May 12, 2014", 10 pgs.
"U.S. Appl. No. 13/650,616, Non Final Office Action mailed Oct. 1, 2014", 8 pgs.
"U.S. Appl. No. 13/650,736, Non Final Office Action mailed Nov. 28, 2014", 20 pgs.
"U.S. Appl. No. 13/651,066, Final Office Action mailed Oct. 28, 2014", 9 pgs.
"U.S. Appl. No. 13/651,066, Response filed Oct. 9, 2014 to Non Final Office Action mailed Jul. 15, 2014", 10 pgs.
"U.S. Appl. No. 13/650,616, Advisory Action mailed May 27, 2015", 3 pgs.
"U.S. Appl. No. 13/650,616, Response filed Apr. 20, 2015 to Final Office Action mailed Feb. 20, 2015", 8 pgs.
"U.S. Appl. No. 13/650,616, Response filed Jun. 9, 2015 to Advisory Action mailed May 27, 2015", 7 pgs.
"U.S. Appl. No. 13/650,736, Advisory Action mailed Jun. 2, 2015", 3 pgs.
"U.S. Appl. No. 13/650,736, Examiner Interview Summary mailed May 26, 2015", 3 pgs.
"U.S. Appl. No. 13/650,736, Final Office Action mailed Apr. 9, 2015", 13 pgs.
"U.S. Appl. No. 13/650,736, Response filed May 22, 2015 to Final Office Action mailed Apr. 9, 2015", 13 pgs.
"U.S. Appl. No. 13/651,066, Examiner Interview Summary mailed Jun. 10, 2015", 3 pgs.
"U.S. Appl. No. 13/651,066, Non Final Office Action mailed May 13, 2015", 8 pgs.
"U.S. Appl. No. 13/651,066, Response filed Apr. 27, 2015 to Non Final Office Action mailed Feb. 5, 2015", 7 pgs.
"U.S. Appl. No. 13/651,066, Response filed Jun. 4, 2015 to Non Final Office Action mailed May 13, 2015", 10 pgs.
"U.S. Appl. No. 13/650,572, Notice of Allowance mailed Jan. 16, 2015", 8 pgs.
"U.S. Appl. No. 13/650,616, Final Office Action mailed Feb. 20, 2015", 8 pgs.
"U.S. Appl. No. 13/650,616, Response filed Dec. 19, 2014 to Non Final Office Action mailed Oct. 1, 2014", 9 pgs.
"U.S. Appl. No. 13/651,066, Non Final Office Action mailed Feb. 5, 2015", 7 pgs.
"U.S. Appl. No. 13/651,066, Response filed Jan. 19, 2015 to Final Office Action mailed Oct. 28, 2014", 10 pgs.
"U.S. Appl. No. 13/650,616, Notice of Allowance mailed Jul. 14, 2015", 9 pgs.
"U.S. Appl. No. 13/650,616, Notice of Allowance mailed Aug. 21, 2015", 8 pgs.
"U.S. Appl. No. 13/650,736, Corrected Notice of Allowance mailed Aug. 12, 2015", 4 pgs.
"U.S. Appl. No. 13/650,736, Notice of Allowance mailed Jul. 27, 2015", 8 pgs.
"U.S. Appl. No. 13/651,066, Notice of Allowance mailed Jun. 24, 2015", 8 pgs.

* cited by examiner

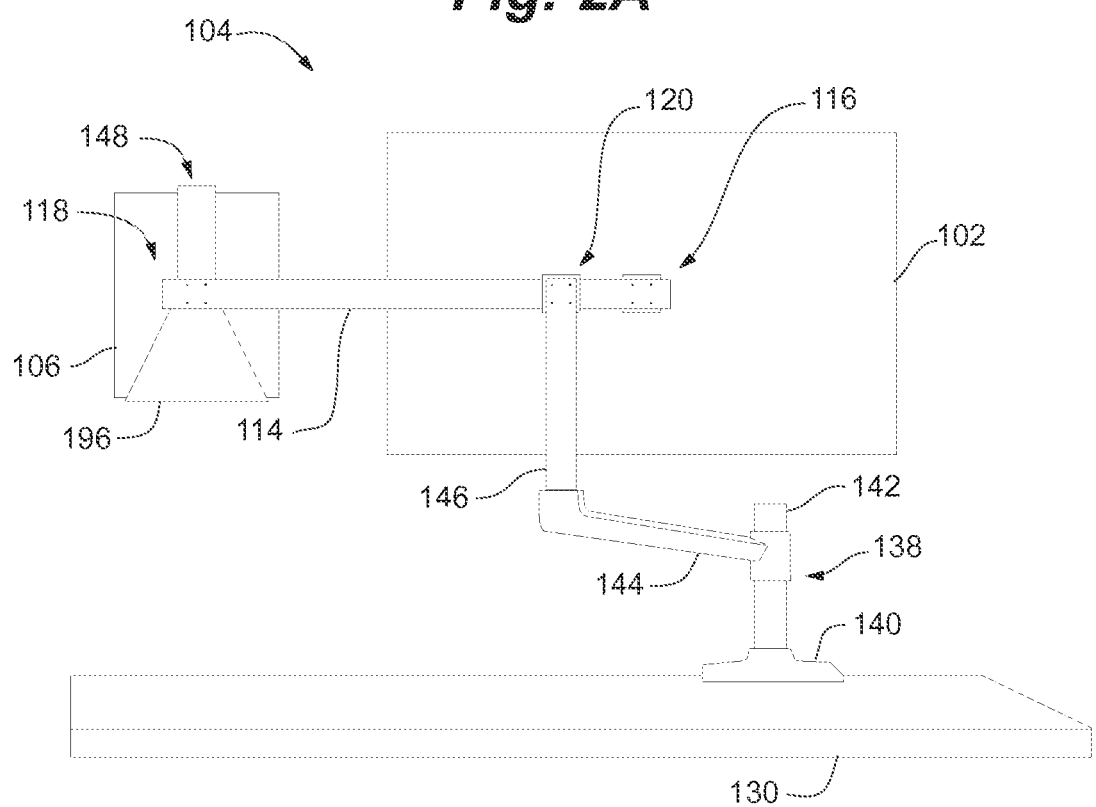

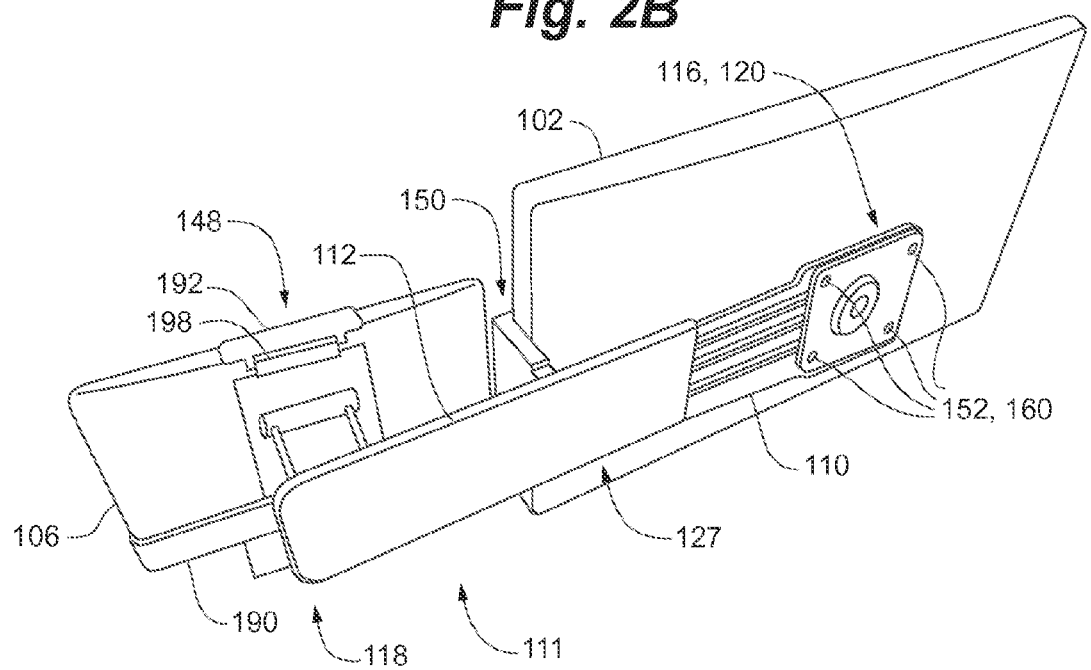

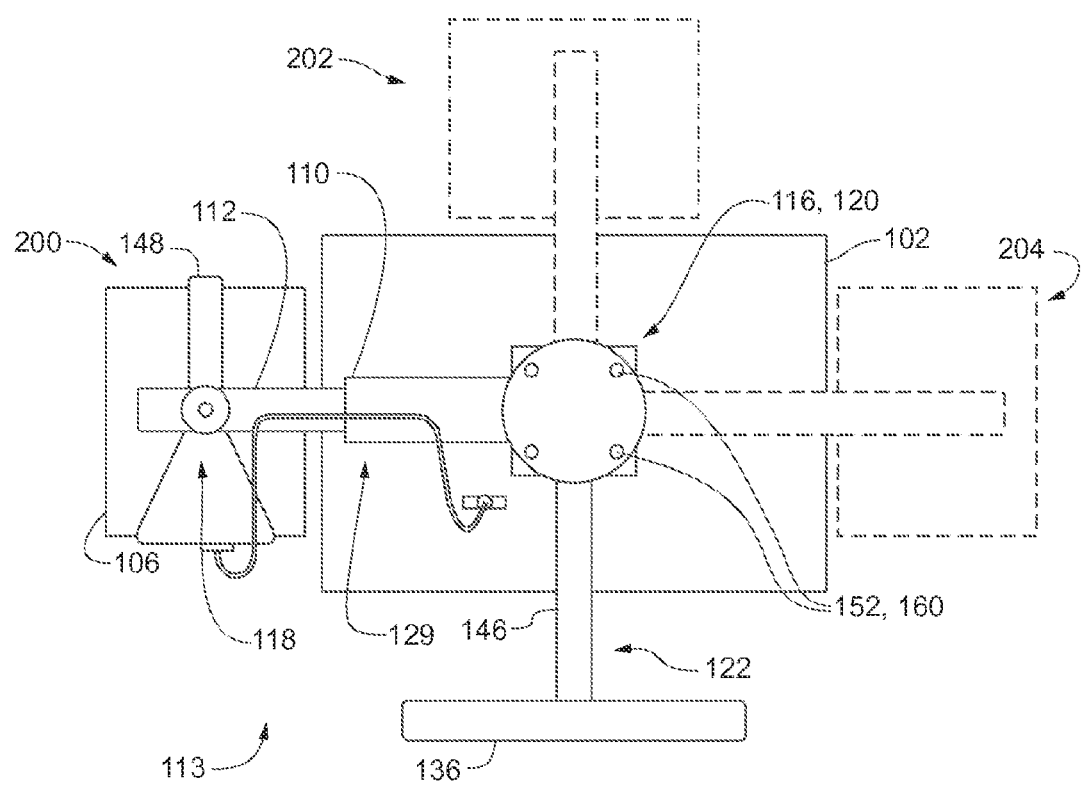

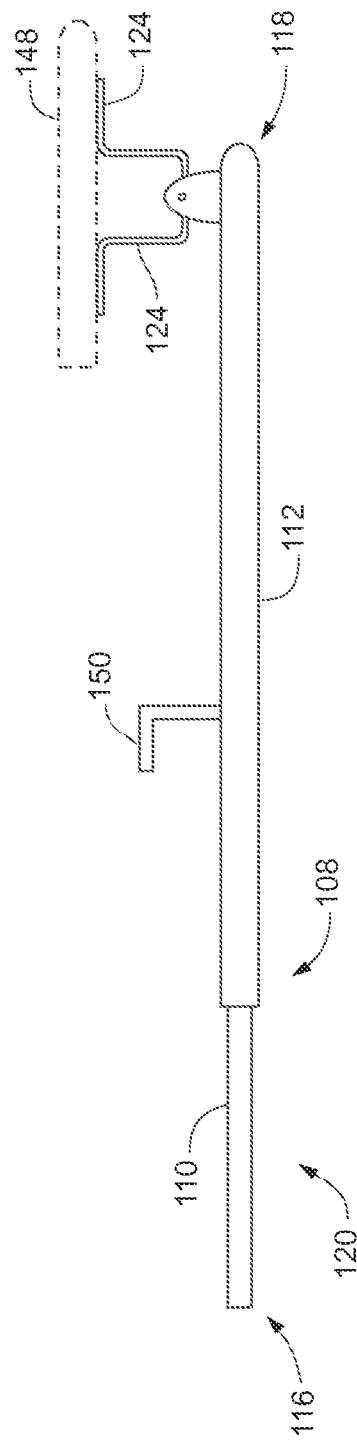

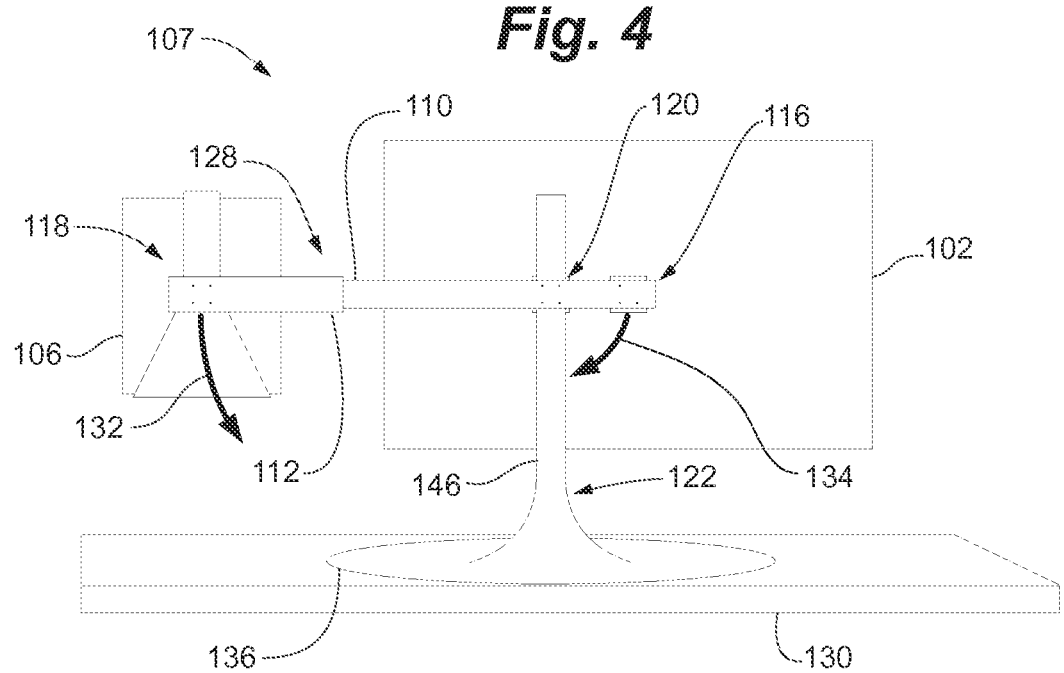

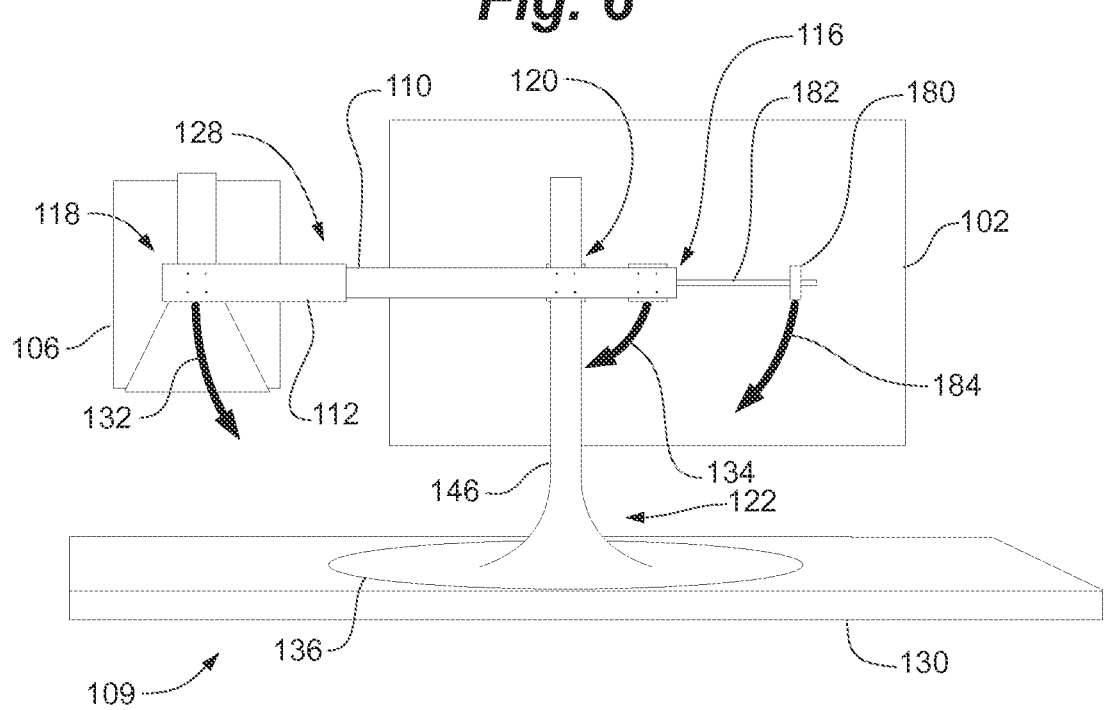

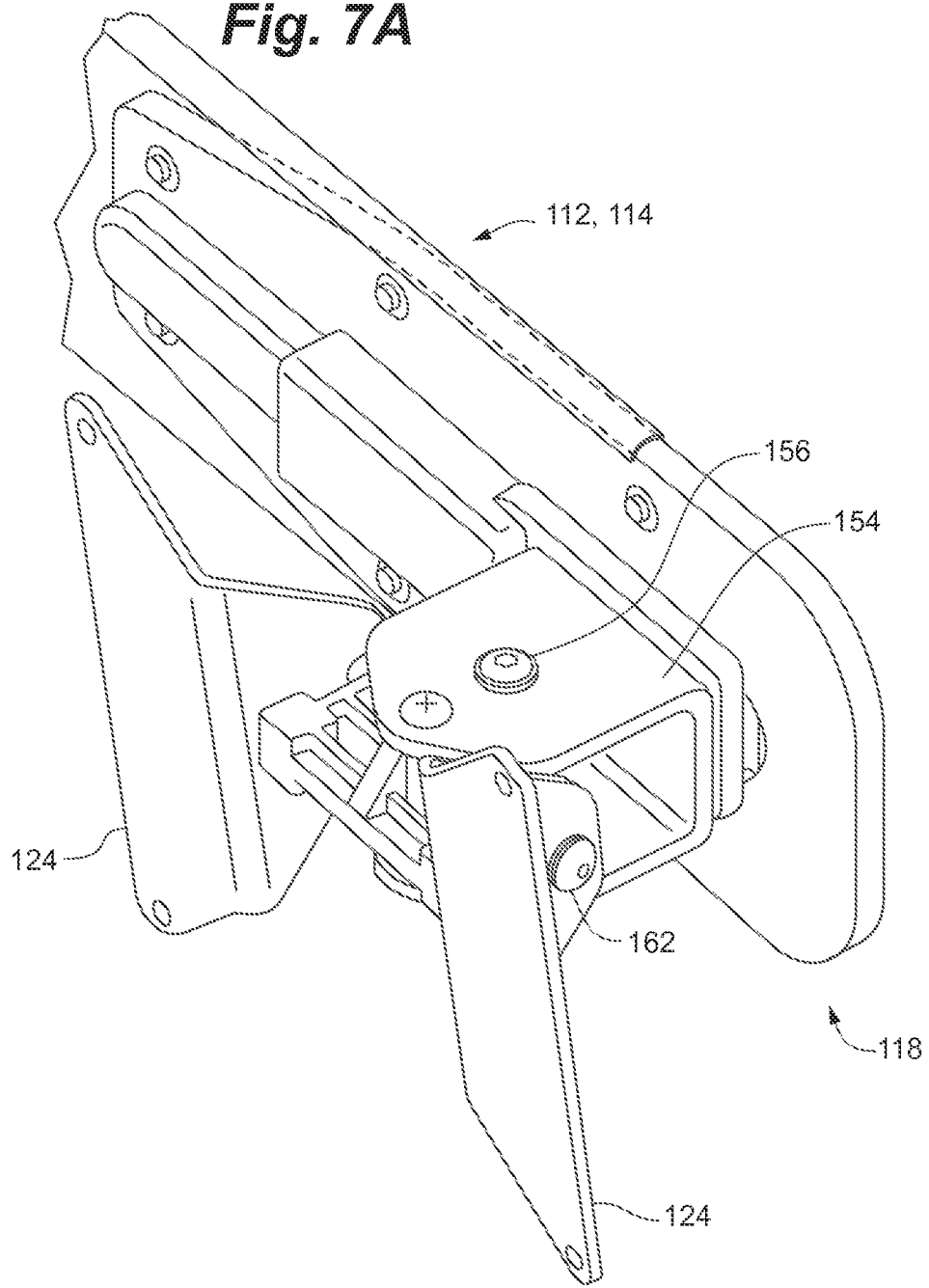

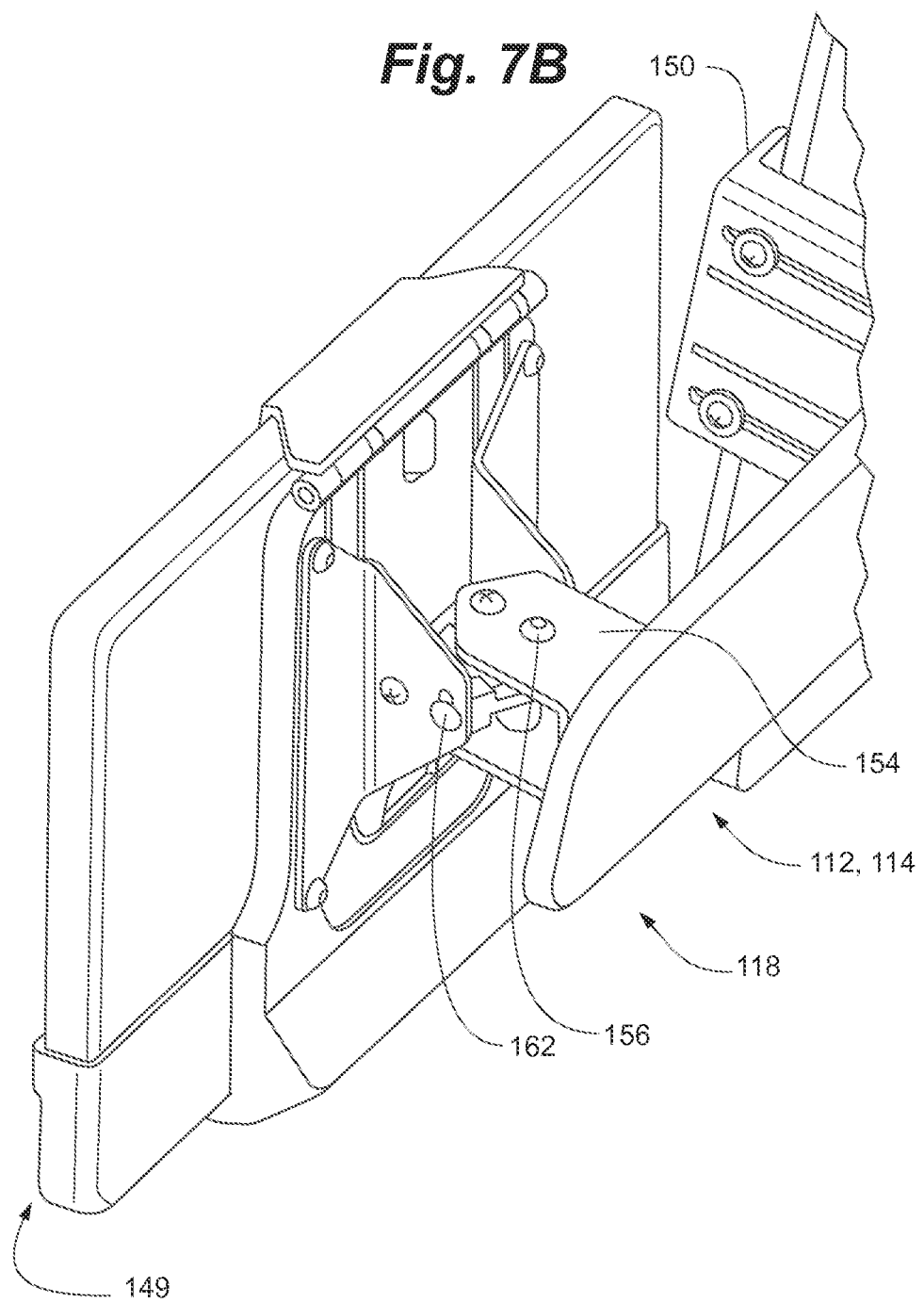

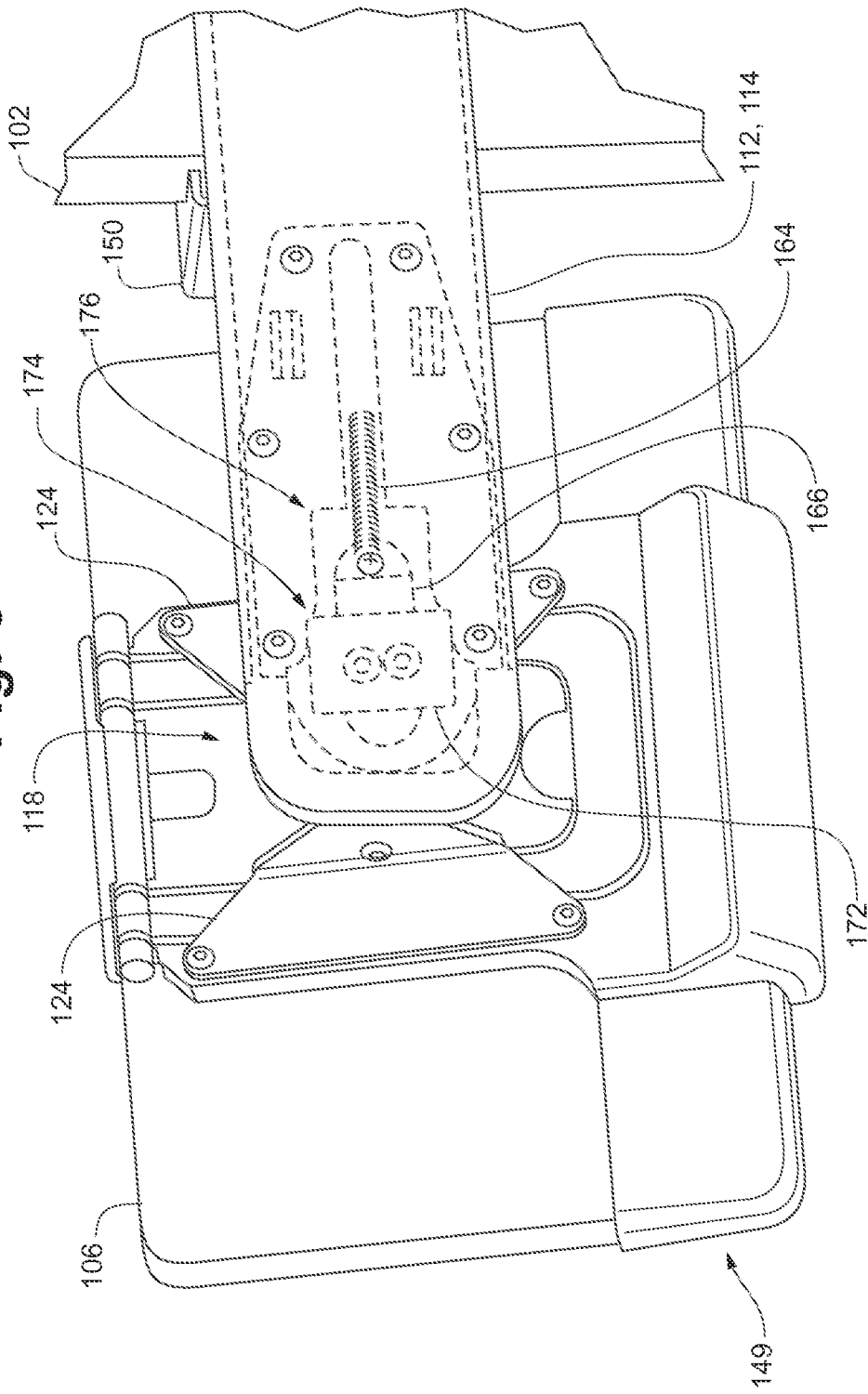

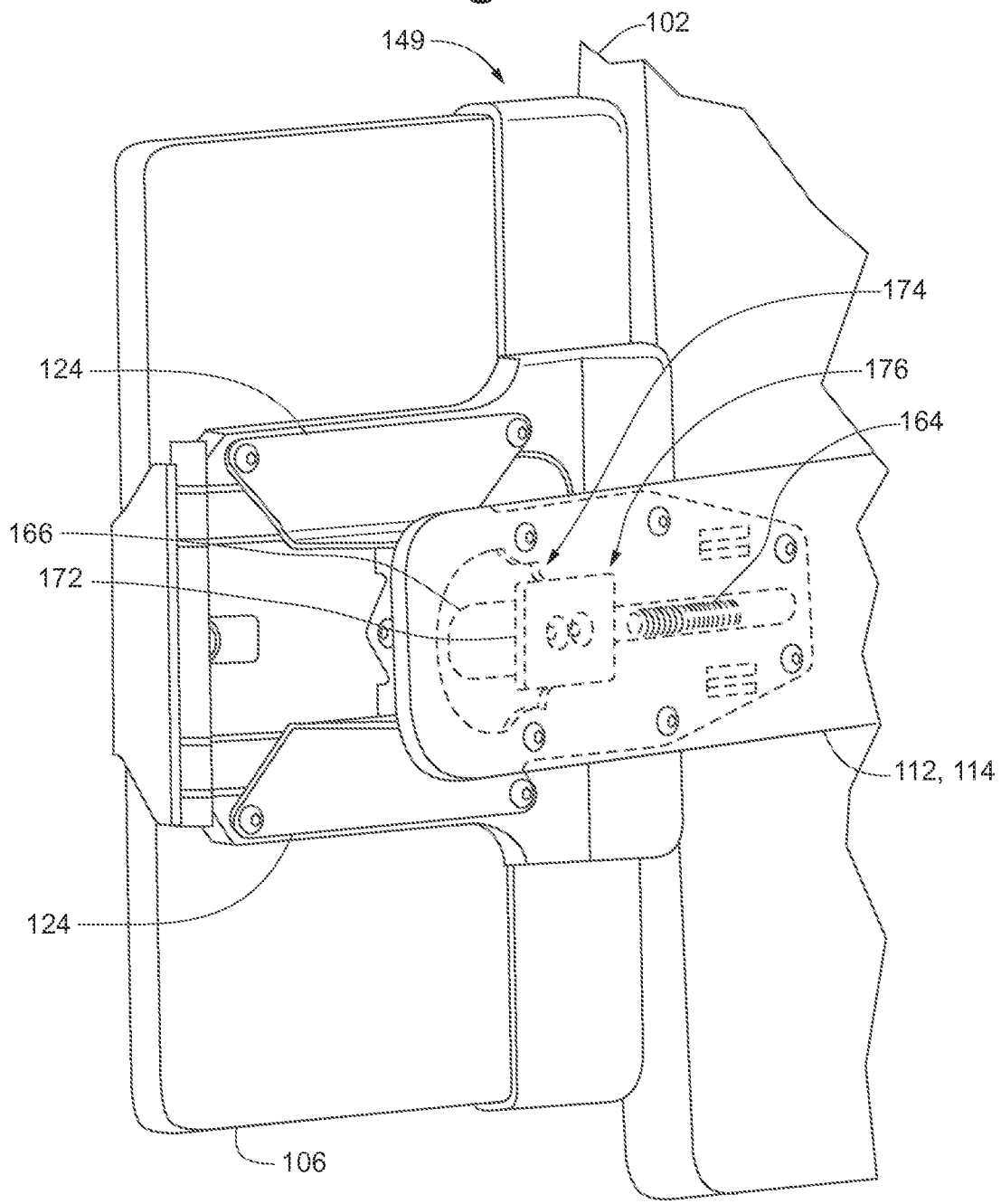

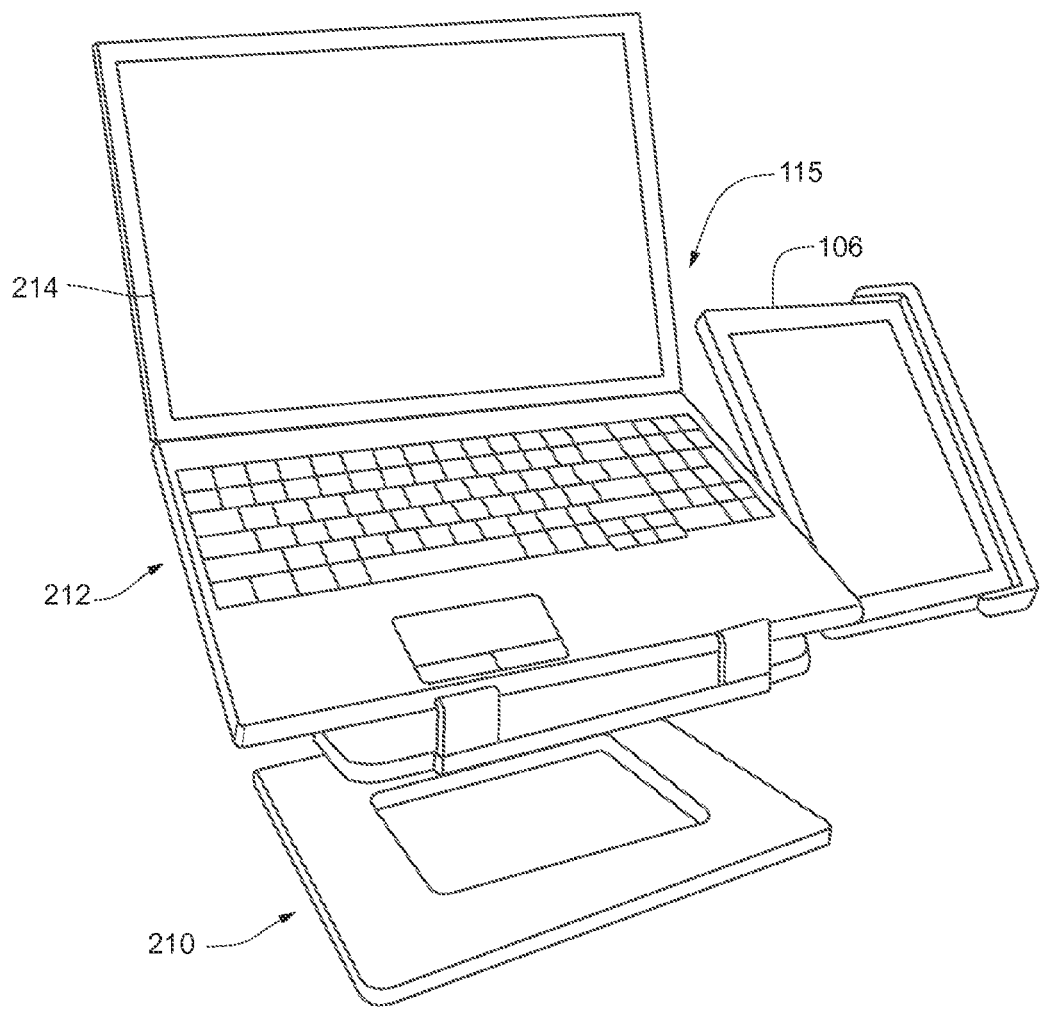

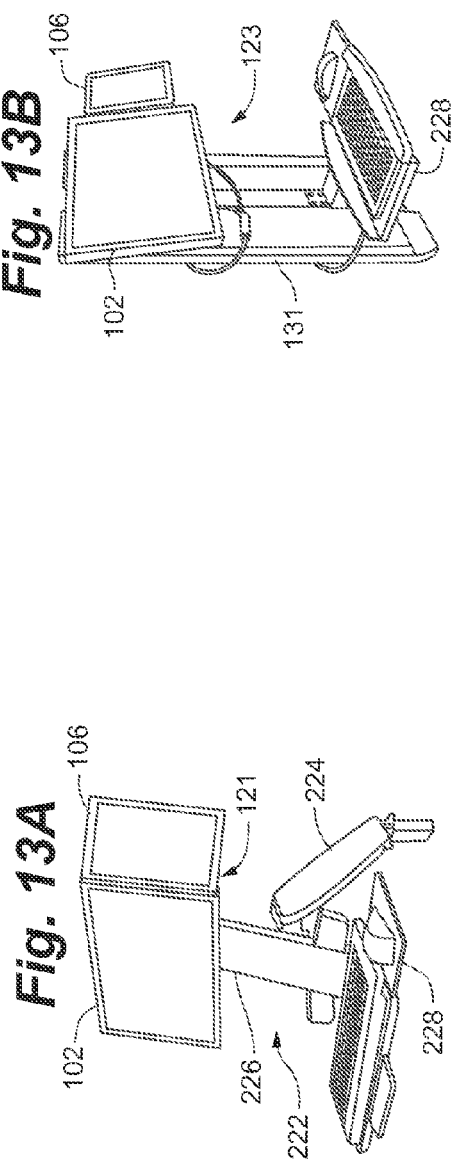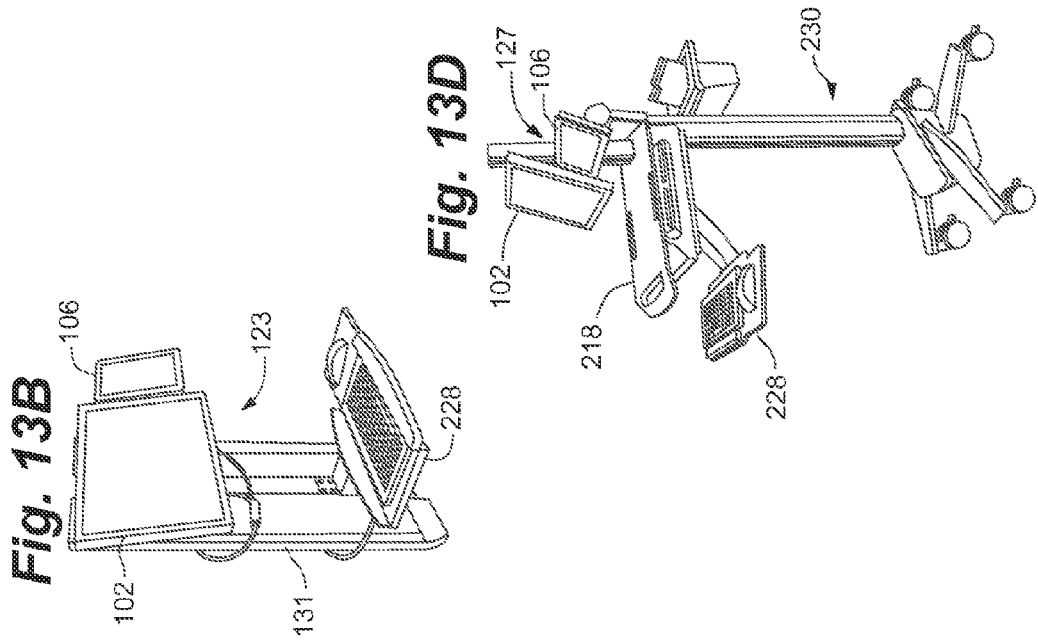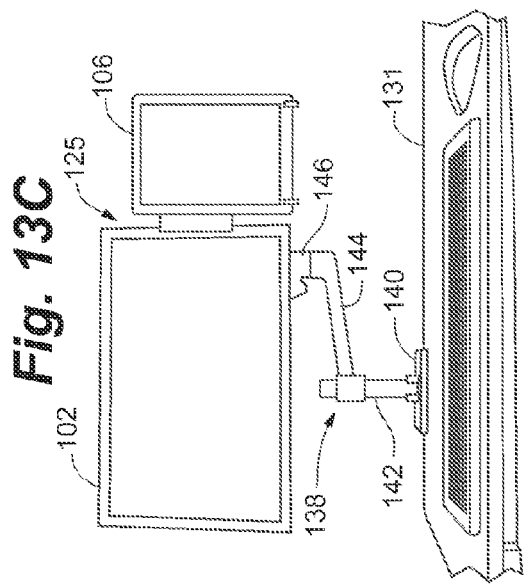

TABLET MOUNTING ARM SYSTEMS AND METHODS

RELATED APPLICATIONS

This application claims the benefit of U.S. Provisional Application Ser. Nos. 61/547,257, 61/553,620, 61/583,847, and 61/590,032, all four of which are entitled Tablet Mounting Systems and Methods, filed Oct. 14, 2011, Oct. 31, 2011, Jan. 6, 2012, and Jan. 24, 2012, respectively, the contents of each of which are hereby incorporated by reference.

FIELD

This disclosure generally relates to systems, devices and methods for supporting a mobile computing device, such as a tablet computing device.

BACKGROUND

Tablet computing devices, sometimes referred to as tablets, or as tablet computers, are generally planar, lightweight devices that include a touch-screen display. Examples include the Apple iPad, Kindle Fire, Motorola Xoom, Samsung Galaxy, Blackberry Playbook, LG Optimus Pad, Dell Streak, HP TouchPad, HTC Flyer, and Viewsonic ViewPad. Generally, tablets have a rectangular form factor that may be considered smaller than a traditional laptop or desktop computer monitor but larger than a smaller electronic device such as a smartphone. For example, in some cases tablets may be about 20 CM to about 30 CM in length, about 10 CM to about 20 CM in height, and about 1 CM in thickness or less, with a weight of between about 400 grams and about 1 KG. Tablets also generally have a display panel (e.g. LCD or TFT) with a screen size of between about 15 CM and about 25 CM, and may include a variety of other features such as front and/or rear camera(s), wire or cable connector(s) (e.g., proprietary, HDMI, USB, audio, charging/power, etc.), and wireless network connections (e.g., 3G/4G, Wi-Fi). Tablets may also currently have between about 500 MB and about 1 GB of RAM and between about 16 GB and about 64 GB of storage memory.

Tablets have many features that make them portable by nature. For example, tablets are battery powered and need only to be plugged in periodically to recharge the battery; the touch-screen display of tablets allows tablets to be operated without the use of a computer peripheral device like a mouse or keyboard; and, as noted above, the 3G/4G and WiFi network connections provide the tablet mobile internet connectivity. These features of tablets, in addition to their small form factor, allow for a high degree of portability. Consequently, a single tablet is often used in many different environments.

In most environments a user will operate a tablet while simply holding it in her hands. Some environments, however, may provide other opportunities to position a tablet. For example, a person using a tablet at a desk may place the tablet flat on the desk, prop the tablet up with books, or lean the tablet up against a wall. In addition, some tablet cases or covers are able to fold into a configuration that supports the tablet in a free-standing position.

SUMMARY

Embodiments described herein generally relate to tablet mounting systems and methods. According to one aspect, a tablet mounting system is provided. The tablet mounting system includes a support arm having a first end and a second end and a tablet mount configured to attach to the support arm. The support arm includes a tablet portion located near the first end of the support arm for supporting a tablet. A monitor portion is located between the tablet portion and the second end of the support arm for supporting a display monitor. Further, a support portion is located between the first end and the second end of the support arm. The support portion is configured to attach to a support object such as, for example, a desk, wall, desk stand, display arm, and the like. The support portion is located closer to the monitor portion of the support arm than to the tablet portion of the support arm. The tablet mount is configured to support a tablet and to attach to the tablet portion of the support arm, wherein in an attached state the support arm is configured to position the tablet mount and the supported tablet relative to the support object.

According to another aspect, a tablet mounting system is provided having a projection arm and an extension arm interconnected to form an extensible arm assembly. The extension arm is longitudinally movable relative to the projection arm to extend and retract between a fully extended position and a fully retracted position, while the projection arm is interconnected near the first end of the projection arm and the extension arm is interconnected near the second end of the extension arm. In some cases, the projection arm includes first and second ends as well as a monitor portion located near the second end for supporting a display monitor and a support portion located between the first end and the second end. The support portion is configured to attach the projection arm, and thus the system, to a support object. The extension arm also has a first end and a second end, and includes a tablet portion located near the first end that is configured to support a tablet.

According to another aspect, a tablet mounting system is provided that includes a base, a support member, a support arm, and a tablet mount. The base is configured to engage with a support surface, such as a surface of a desk, counter, wall, or other desirable support surface. The support member is configured to couple to and extend away from the base, while the support arm includes a support portion configured to attach to the support member. The support arm also defines a first end and a second end and includes a tablet portion located near the first end for supporting a tablet, by way of the attached tablet mount. The support arm also includes a monitor portion located between the tablet portion and the second end for supporting a display monitor. The support portion is located between the first end and the second end of the support arm, and is located closer to the monitor portion of the support arm than to the tablet portion of the support arm. In an attached state the base, the support member, and the support arm are configured to position the tablet mount and the supported tablet relative to the surface.

According to another aspect, a method for mounting a tablet with a tablet mounting system is provided. The method generally includes providing a tablet, providing a support arm, attaching a tablet mount to a tablet portion of the support arm, and supporting the tablet with the tablet mount. In some cases the support arm has a first end and a second end and includes a tablet portion located near the first end of the support arm for supporting the tablet, a monitor portion located between the tablet portion and the second end of the support arm for supporting a display monitor, and a support portion located between the first end and the second end of the support arm. The support portion is further configured to attach to a support object, and is located closer to the monitor portion of the support arm than to the tablet portion of the support arm.

These and various other features and advantages will be apparent from a reading of the following detailed description.

BRIEF DESCRIPTION OF THE DRAWINGS

The following drawings are illustrative of particular embodiments of the invention and therefore do not limit the scope of the invention. The drawings are not necessarily to scale (unless so stated) and are intended for use in conjunction with the explanations in the following detailed description. Embodiments of the invention will hereinafter be described in conjunction with the appended drawings, wherein like numerals denote like elements.

FIG. 2A is a rear elevation view of a tablet mounting system with a supported tablet and display monitor, in accordance with an embodiment.

FIG. 2B is a rear perspective view of a tablet mounting system with a supported tablet and display monitor in accordance with an embodiment.

FIG. 2C is a rear elevation view of a tablet mounting system with a supported tablet and display monitor, depicted in three orientations, in accordance with an embodiment.

FIG. 3B is a top plan view of the support arm of FIG. 3A.

FIG. 4 is a rear elevation view of a tablet mounting system with a supported tablet and display monitor, in accordance with an embodiment.

FIG. 6 is a rear elevation view of a tablet mounting system with a supported tablet and display monitor, in accordance with an embodiment.

FIG. 7A is a partial front perspective view of a support arm in accordance with an embodiment.

FIG. 7B is a partial rear perspective view of a tablet mounting system with a supported tablet in accordance with an embodiment.

FIG. 8 is a partial rear perspective view of a tablet mounting system with a supported tablet in accordance with an embodiment.

FIG. 9 is a partial rear perspective view of a tablet mounting system with a supported tablet in accordance with an embodiment.

FIG. 10 is a front perspective view of a tablet mounting system attached to a laptop stand, in accordance with an embodiment.

FIG. 13A is a front perspective view of a tablet mounting system in accordance with an embodiment.

FIG. 13B is a front perspective view of a tablet mounting system in accordance with an embodiment.

FIG. 13C is a front perspective view of a tablet mounting system in accordance with an embodiment.

FIG. 13D is a front perspective view of a tablet mounting system in accordance with an embodiment.

DETAILED DESCRIPTION

The following detailed description is exemplary in nature and is not intended to limit the scope, applicability, or configuration of the invention in any way. Rather, the following description provides some practical illustrations for implementing exemplary embodiments of the present invention. Examples of constructions, materials, dimensions, and manufacturing processes are provided for selected elements, and all other elements employ that which is known to those of ordinary skill in the field of the invention. Those skilled in the art will recognize that many of the noted examples have a variety of suitable alternatives.

Embodiments described herein provide systems, devices, and methods for mounting and supporting tablet computing devices. As discussed above, tablet computing devices are well known and are also referred to herein as tablets. In general, a tablet is a mobile computer, typically integrated into a flat touch screen and primarily operated by touching the screen. This can often include the use of an onscreen virtual keyboard, rather than a physical keyboard. The form factor of a tablet offers a more mobile way to interact with a computer.

Although a tablet can be a very mobile computing device, in some situations a user may prefer to mount a tablet. A mounted tablet can make it easier for a user to view and, in some instances, to use the tablet screen. Thus, in some embodiments a tablet can be advantageously mounted to a desk stand, to a work cart or to a wall-mounted display arm, for example. A tablet can also be mounted in an orientation such that the tablet's touch screen can be used to operate the tablet. In some cases, a tablet can also be mounted such that it can be operated via an external keyboard, external mouse, and/or the tablet's touch screen.

A mounted tablet can also be used as an extension or an auxiliary display, and in this manner may be used in combination with at least one other display device, to create a multiple display system. Accordingly, some embodiments allow for a tablet to be used as an auxiliary display, located above, below, or to either side of a primary display. Such multiple display systems can include a separate computer, or other computing device, connected to at least one other display device. In some multiple display embodiments, the tablet may be the only available computer and thus may act as the driver for images displayed on the tablet's screen and on one or more other display device(s).

In some applications it may be beneficial to have a single display. In other applications, two displays may be needed. In yet other applications it may be beneficial to have three or more displays. Consequently, some embodiments allow for a tablet to be used as a solitary display; as a second display in a two-display arrangement; as a third display in a three-display arrangement; or as an additional display in an arrangement of four displays or more.

Figure 1:
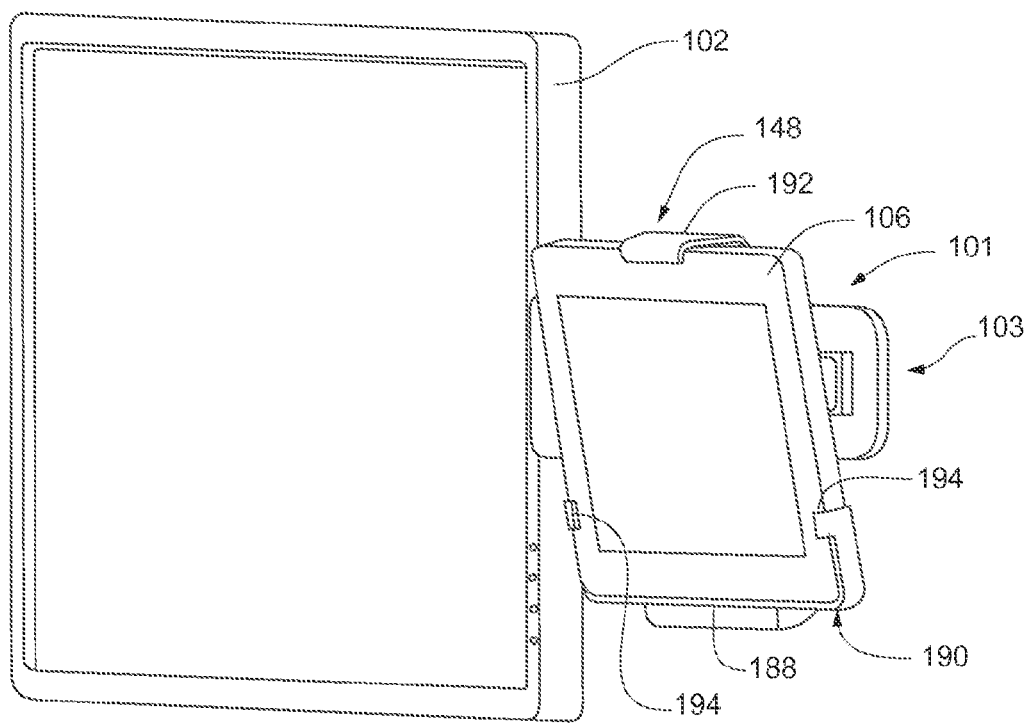
FIG. 1 is a front perspective view of a tablet mounting system with a supported tablet and display monitor in accordance with an embodiment.

FIG. 1 shows a perspective view of one example of a tablet mounting system 101 according to some embodiments. In general, the tablet mounting system 101 includes a support arm 103 that can be used to mount, position, and support a tablet 106 in a desired location and/or orientation with respect to a user. The mounting system 101, including the support arm 103, is generally configured to support the tablet 106 by coupling it to a support object—in this example, a display monitor 102. Some tablet mounting systems may be used to couple a tablet to other support objects, such as a laptop stand, a laptop docking station, a display monitor stand, a display monitor mount, a desk stand, a wall-mounted arm, or a sit-stand workstation, for example. In turn, support objects may rest on a desk or other work surface, be attached to a mobile cart or to a wall, or be clamped to a desk or counter, for example. In addition, a tablet mounting system such as the system 101 shown in FIG. 1 can also be coupled directly to a mobile cart, a wall, or other suitable objects or surfaces.

FIGS. 2A, 2B, and 2C illustrate examples of tablet mounting systems using, among other things, different types of support arms to mount and position a tablet. FIG. 2A is a rear elevation view of a tablet mounting system 104 that includes a support arm 114 which can be of a given, fixed length according to some embodiments. As illustrated, the support arm 114 has a monitor portion 116, a tablet portion 118 and a support portion 120. The monitor portion 116 is attached to and supports a display monitor 102. The tablet portion 118 is attached to a tablet mount 148 and supports a tablet 106. As will be discussed in greater detail below, the tablet mount 148 can assist in securely holding the tablet 106.

In the arrangement depicted, the tablet mounting system 104 in FIG. 2A also includes a desk clamp 138, which includes a clamp 140 used to attach the desk clamp 138 to a desk 130 or other horizontal surface. The desk clamp 138 also includes a vertical portion 142, a pivotal portion 144 and a support object or support member in the form of a vertical riser 146. The support portion 120 of the support arm 114 is attached to the vertical riser 146. Of course it should be appreciated that the desk clamp 138 is just one example of a possible support object or structure that could be used to provide a supporting connection between the support arm 114 and the ultimate foundation for the system, such as the surface of the desk 130. In addition, in some cases a tablet mounting system may include a support arm that is configured to mount or attach directly to a support object, such as a desk, table, wall, or the like, without intermediate support elements such as the desk clamp 138 in FIG. 2A or other arms, risers, clamps, etc.

FIG. 2B is a rear perspective view of another tablet mounting system 111 according to an embodiment. In this embodiment, the tablet mounting system 111 includes a support arm 127 in the form of an extensible arm assembly including a projection arm 110 and an extension arm 112. The tablet mounting system 111 also includes a monitor portion 116 configured to support a display monitor 102, a tablet portion 118 configured to support a tablet 106 with a tablet mount 148, and a support portion 120 configured to attach to a support object, such as a part of a desk or wall-mounted display stand system, a cart, or directly to a wall or other structure. In terms of the entire support arm 127 and with reference to the drawing in FIG. 2B, the tablet portion 118 is located near the left hand side of the support arm 127 as viewed in FIG. 2B, the monitor portion 116 is located near the right hand side of the support arm 127, and the support portion 120 is located between left hand side and the right hand side of the support arm. In terms of the projection and extension arms 110, 112, FIG. 2B shows the tablet portion 118 located near the left hand side of the extension arm 112 and the monitor portion 116 and the support portion 120 both located at the right hand side of the projection arm 110.

FIG. 2C is a rear elevation view of a tablet mounting system 113 according to some embodiments that includes a support arm 129 that can be configured to position a tablet 106 in multiple locations/orientations relative to a display 102, an external monitor stand 122, and other reference points that remain stationary throughout the multiple orientations. As depicted in FIG. 2C, the tablet mounting system 113 includes an external monitor stand 122 having a base 136 which supports a vertical riser 146. The riser 146 in turn supports a support arm 129 configured with a tablet portion 118, a monitor portion 116, and a support portion 120, which in this example is where the riser 146 attaches. The monitor portion 116, which is co-located with the support portion 120 on the projection arm 110, supports a display monitor 102 and the tablet portion 118 supports a tablet 106 in a first orientation 200. The tablet 106 is shown supported by the tablet mounting system 113 to the left of the display monitor 102 as viewed in FIG. 2C.

Additional tablet mounting system orientations are also possible, as shown by the second orientation 202 and a third orientation 204, illustrated in dashed lines in FIG. 2C. As shown, in some cases the orientation of the support arm 129 can be changed in order to support a tablet 106 above the display monitor 102, as indicated by the second orientation 202 or on the opposite side of the display monitor 102, as indicated by the third orientation 204. To change the orientation of the support arm 129 within the tablet mounting system 113, the support portion 120 on the support arm 129 is configured to also attach to the external monitor stand 122 so that the projection arm 110 and the extension arm 112 can extend vertically above the monitor stand 122.

Thus, the support portion 120 is configured to attach to the external monitor stand 122 in multiple (e.g., two, three, or more) support portion orientations. In this case, the support portion 120 has a second orientation indexed from a first orientation by 90 degrees, and a third orientation indexed from the first orientation by 180 degrees. In addition, in order for the same tablet mounting system to be used in the first orientation 200 and the second orientation 202, the monitor portion 116 is configured to be attached to the display monitor 102 in three corresponding monitor portion orientations, each indexed from the other by 90 degrees. Although not shown, the orientation of the tablet 106 may also be changed, e.g., using one or more rotation, pivot, and/or tilt mechanisms as will be discussed in further detail hereinafter. Further, although not shown in FIG. 2C, the tablet mounting system can also position a tablet below the monitor 102, or possibly as other angles, using the principles already described. Thus, a tablet mounting system can support a tablet in a plurality of orientations relative to a display monitor or other support object.

Figure 3A:
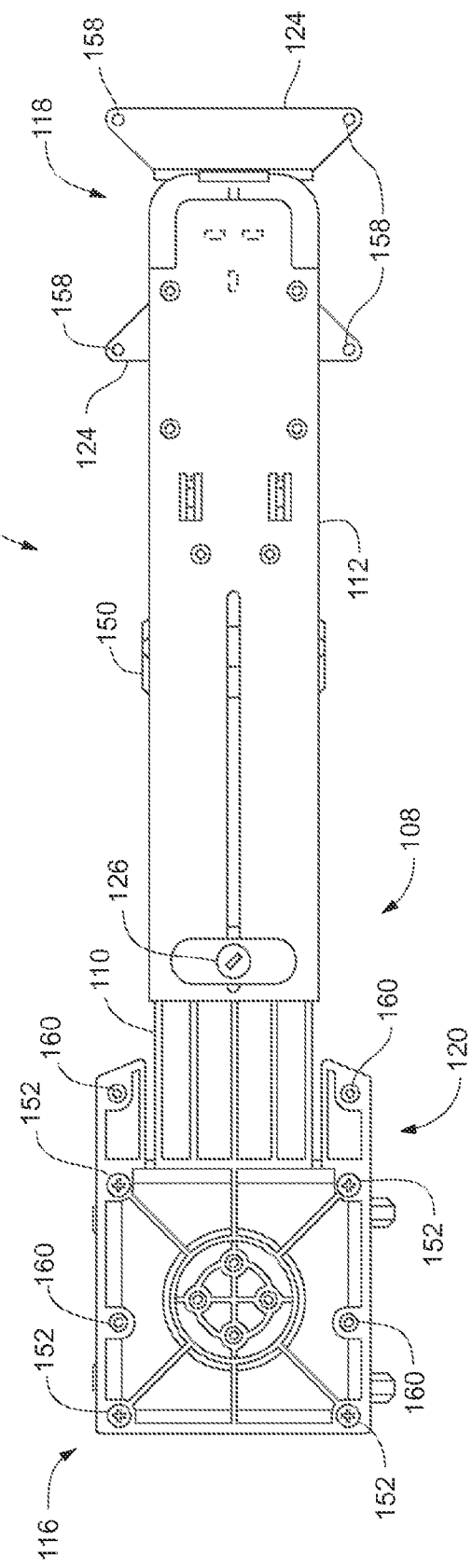
FIG. 3A is a rear elevation view of a support arm in accordance with an embodiment.

FIG. 3A is a side elevation view, and FIG. 3B is a top representation, of one possible embodiment of a tablet support arm 105, similar in some ways to the support arm 127 shown in FIGS. 2B and 2C. In this embodiment, the support arm 105 is provided in the form of an extensible arm 108 that includes a projection arm 110 and an extension arm 112. The projection arm 110 and the extension arm 112 are interconnected such that the extension arm is longitudinally movable relative to the projection arm. In this way the extensible arm 108 can be extended and retracted from a fully extended position to a fully retracted position.

The relative movement of the projection arm 110 with respect to the extension arm 112 can be achieved in a number of ways. As just one example, the projection arm 110 can be slidably (or otherwise translatably) connected to the extension arm 112 through the use of coated or lubricated interconnected channels and slides or through the use of bearings. Other suitable methods for accomplishing the desired relative telescopic motion can also readily be contemplated. In some embodiments, the movement of the extension arm relative to the projection arm can be regulated through the use of a spring element (not shown). In some embodiments, the projection arm 110 can have a releasable fastener that engages with the extension arm, such as a thumb screw 126, as depicted in FIG. 3A. The releasable fastener can also be a quarter-turn or half-turn fastener, a captive fastener, a clasp, a compression fastener, or any other fastening device that can selectably fix the position of the extension arm with respect to the projection arm in a plurality of telescopic positions, and selectably release the extension arm, such that the extension arm can again be telescopically moved relative to the projection arm. In some embodiments, a friction device, such as a rubber or silicone collar, can also or alternatively be used.

As depicted in FIGS. 3A and 3B and similar to previous descriptions of support arms, the support arm 105 includes a monitor portion 116 that is configured to support a display monitor, a tablet portion 118 for supporting a tablet, and a support portion 120 that is configured to attach to an object supporting the support arm 105 and any equipment (e.g., display monitors, tablets, etc.) to which the arm is coupled. The monitor portion 116 is located near the left hand side of the projection arm 110 as viewed in FIGS. 3A and 3B, which also corresponds with the left hand side of the extensible arm 108 and the support arm 105. The tablet portion 118 is located near the right hand side of the extension arm 112 as viewed in FIGS. 3A and 3B, which also corresponds with the right hand side of the extensible arm 108, and the support arm 105. In this example, the support portion 120 partially overlaps with the monitor portion 116. As will be discussed further herein, the support portion 120 is often at least partially or fully overlapped with the monitor portion 116, or may at least be located closer to the monitor portion 116 than to the tablet portion 118, although this should not be considered a strict requirement in all embodiments.

Turning to FIG. 4, some factors that can help determine the location of a support portion relative to a monitor portion and a tablet portion on a support arm will now be discussed. FIG. 4 depicts another example of a tablet mounting system 107, which in this case includes an extensible support arm 128 having an extension arm portion 112 and a projection arm portion 110. The support arm 128 includes a support portion 120 that is attached to a vertical riser 146 and base 136 of a monitor stand 122. The support arm 128 also includes a monitor portion 116 that supports a display monitor 102 and a tablet portion 118 that supports a tablet 106.

According to some embodiments, the particular locations of the tablet portion 118, the support portion 120, and the monitor portion 116 generate forces that tend to interact. For example, as shown in FIG. 4, the location of the tablet portion 118 relative to the support portion 120 along the length of the extension arm 112 and projection arm 110 can create a first rotational force 132 on the tablet mounting system 107. As used herein, "rotational force" is used to describe the tendency of a force to twist or rotate an object, which can also be called a "moment of force," or simply a "moment." A rotational force is the product of a force and the moment arm, which is the perpendicular distance from the point or center of rotation, to the line of action of the force.

In this case, the first rotational force 132 acts about a center. For example, in this case first rotational force 132 is acting counterclockwise centered about the support portion 120. Thus, the direction (being, e.g., clockwise or counterclockwise) of the first rotational force can be affected by the location of the tablet portion 118 with respect to the support position 120. In addition, the magnitude of the first rotational force 132 can be affected by (a) the distance between the tablet and support portions, (b) the mass of a supported tablet and/or tablet mount, and/or (c) the linear density of the extensible arm. Similarly, the placement of the monitor portion 116, relative to the placement of the support portion 120 along the length of the projection arm 110, can be adapted to create a second rotational force 134. As depicted, the second rotational force 134 acts on the tablet mounting system 107 in a clockwise direction about the support portion 120. As can be appreciated, the magnitude of the second rotational force 134 can be affected by (a) the distance between the monitor portion and the support portion, (b) the mass of the display monitor, and to a lesser extent, (c) the linear density of the projection arm.

In some embodiments, the direction of the first rotational force 132 can be substantially opposite to the direction of the second rotational force 134, while the magnitude of the first rotational force 132 can be substantially equal to the magnitude of the second rotational force 134, which provides a balancing effect as will be appreciated. In some embodiments, other factors such as the size of a base, additional bracing, and the like, may allow for somewhat unequal force magnitudes while still maintaining adequate stability.

As one example, the directions of the rotational forces may be in substantially opposite directions, while the magnitudes of the forces are within 20 to 45% of each other. For example, in the case of a 600 gram total mass for a tablet 106 and a tablet mount, positioned 50 centimeters from the support portion 120, with an extensible arm 112 contributory mass of 400 grams at an effective distance of 25 centimeters, the first rotational force 132 would be 3.92 Nm counterclockwise (0.6 kg×0.5 m×9.8 m/s$^2$+0.4 kg×0.25 m×9.8 m/s$^2$). In the case of a 2.5 kilogram display monitor 102 that is positioned 10 centimeters from the support portion 120, the second rotational force 134 would be 2.45 Nm clockwise (2.5 kg×0.1 m×9.8 m/s$^2$). In this example, the two forces are in opposite directions (counterclockwise as compared to clockwise) and the magnitude of the second force 134 is 37.5% of the first force 132 ((3.92 Nm−2.45 Nm)/3.92 Nm). In some embodiments, the magnitudes of the forces are within 35 to 65% of each other. In the above example, the net force acting on the tablet mounting system 107 is 1.47 Nm counterclockwise (3.92 Nm−2.45 Nm).

Figure 5A:
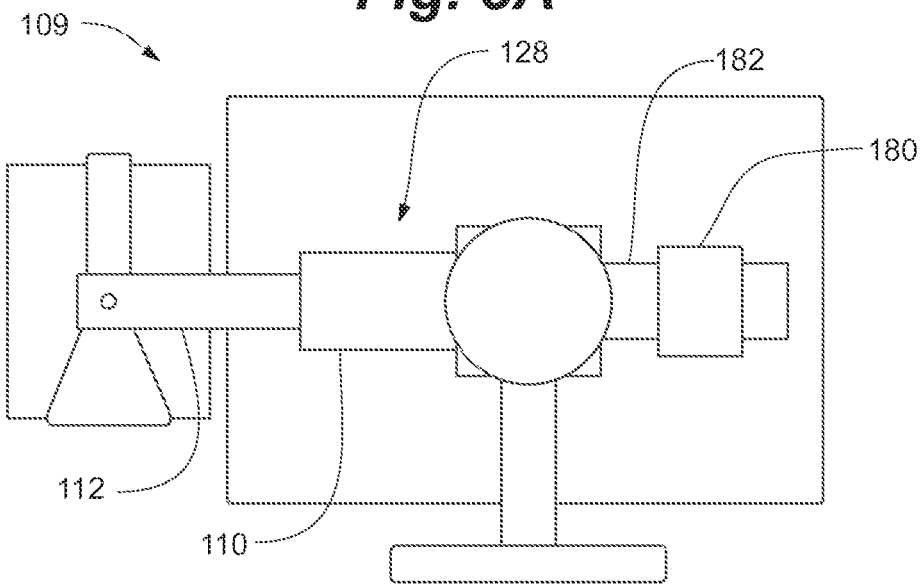
FIG. 5A is a rear elevation view of an apparatus for positioning a display monitor and a tablet, with a supported tablet and display monitor, in accordance with an embodiment.
Figure 5B:
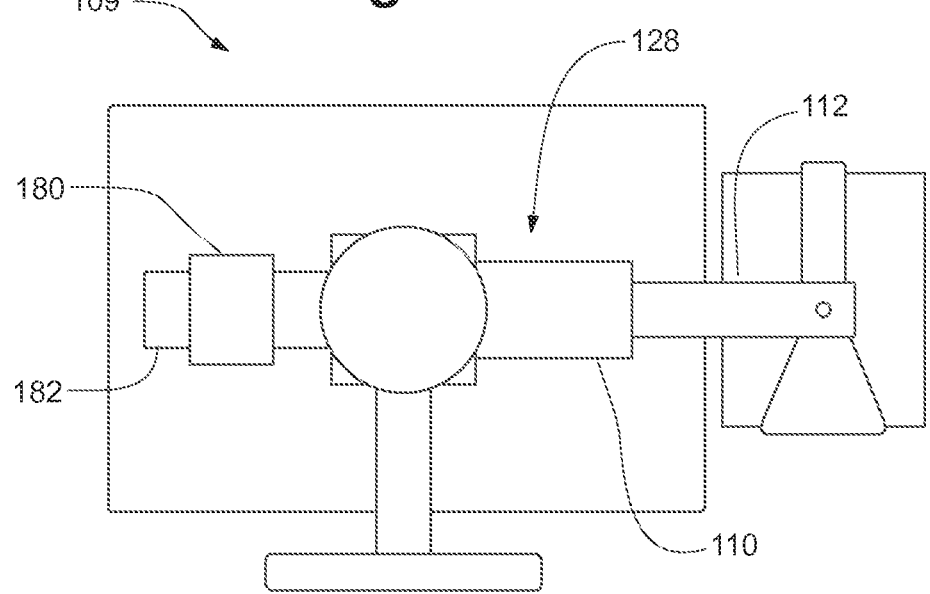
FIG. 5B is a rear elevation view of an apparatus for positioning a display monitor and a tablet, with a supported tablet and display monitor, in accordance with an embodiment.

Additional forces can be generated within a tablet mounting system in order to achieve a desired stability or balance profile. FIGS. 5A and 5B illustrate a tablet mounting system 109 having a movable counterweight 180 attached to a weight beam 182. As shown, the weight beam 182 can extend from support arm 128, in particular from the projection arm 110 in a direction that is opposite to the extension arm 112. This can be to the left or to the right, depending on the orientation of the tablet mounting system 109, as depicted in FIGS. 5A and 5B.

The movable counterweight and the weight beam can be adapted such that the counterweight can travel along a portion of the length of the weight beam. In some embodiments, the counterweight can have a releasable fastener that engages with the weight beam. The releasable fastener can be a thumb screw, a compression fastener, or any other fastening device that can selectably fix the position of the counterweight along the weight beam, and selectably release the counterweight, such that the counterweight can be again moved. In some embodiments, a friction fit can be provided between the counterweight and the weight beam. For example, a frictional force can be adapted such that it can be easily overcome by a user who desires to adjust the location of the weight, while at the same time, the frictional force can be sufficiently great such that the counterweight will not be inadvertently moved.

In some embodiments, the weight beam itself can also be slidably connected with the projection arm. In such embodiments, the weight beam and the projection arm are interconnected such that the weight beam is longitudinally movable relative to the projection arm. In this way the weight beam can be extended and retracted from the projection arm in a telescopic fashion such that the counterweight can be moved from a fully extended position to a fully retracted position. Although not shown, in some embodiments, the movement of the weight beam relative to the projection arm can be regulated through the use of a spring element.

In some embodiments, the movement of the weight beam relative to the projection arm can be configured to correspond to a corresponding movement of the extension arm relative to the projection arm. This can be accomplished through the use of one or more gears, pinions, racks or other similar mechanisms. In such an embodiment, the weight beam can extend out from the projection arm in response to a user extending the extension arm out from the projection arm. A similar movement can also be achieved in response to a retracting movement of the extension arm.

Thus, for some embodiments, the counterweight 180 can be used to create a third rotational force 184, centered about the support portion 120, as depicted in FIG. 6. The magnitude of the third rotational force 184 can be changed according to (a) the mass of the counterweight 180, (b) the position of the counterweight 180 along the weight beam 182, and/or (c) the position of the weight beam 182 relative to the projection arm 110 (for those embodiments that have a weight beam that is longitudinally movable relative to the support/projection arm).

In some embodiments, the direction of the second and third rotational forces 134, 184 can be substantially the same, and they can be substantially opposite to the direction of the first rotational force 132. In some embodiments, the combined magnitude of the second and third rotational forces 134, 184 can be substantially equal to the magnitude of the first rotational force 132. In some embodiments, the direction of the second rotational force 134 and the direction of the third rotational force 184 are substantially the same and are substantially opposite to the direction of the first rotational force 132, while the combined magnitude of the second and third forces are within 20 to 45% of the first force. In some embodiments, the combined magnitudes of the second and third forces are within 35 to 65% of the first force. In some embodiments, the direction of the second rotational force 134 and the direction of the third rotational force 184 are substantially the same and are substantially opposite to the direction of the first rotational force 132, while the magnitude of the first rotational force 132 is not substantially greater than twice the magnitude of the second rotational force 134 combined with the third rotational force 184.

According to some embodiments it may be desirable to balance forces within the tablet mounting system as much as possible by, for example, adjusting the positioning of the tablet portion, support portion, and/or monitor portion, or switching out tablets and/or display monitors to achieve different weight distribution along the support arm. According to some embodiments, it may also be satisfactory or desirable to have somewhat uneven forces within the tablet mounting system. For example, as mentioned above, in some cases it may be desirable to have multiple rotational forces in opposite directions, wherein the combined magnitude of the forces in one direction are within 20 to 45% of the magnitude of the combined forces in the opposite direction. In some cases it might be desirable to have opposing rotational forces with magnitudes that are within 35 to 65% of each other. Still further, in some cases, a first rotational force 132 exhibited by the tablet portion of a support arm is not substantially greater than twice the magnitude of the forces pulling the support arm in the opposite direction (e.g., the second rotational force 134, optionally combined with the third rotational force 184).

According to some embodiments, the placement of the monitor portion in relation to the support portion can be chosen according to the length of a fully extended extensible arm, the length of a completely retracted extensible arm, or an intermediate length of an extensible arm, such that the intermediate length is longer than the completely retracted length and shorter than the fully extended length. In some embodiments, the placement of the monitor portion in relation to the support portion may be chosen in order to reduce a combination of two factors: the net force acting on the system when a tablet is mounted and the net force acting on the system when a tablet is removed. Such a choice may be desirable to reduce the net average force acting on a tablet mounting system (accounting for both situations) rather than optimizing for one situation over the other.

In some cases, a greater degree of imbalance between the forces in a tablet mounting system may be tolerable depending upon one or more additional physical and/or hardware configurations of the tablet mounting system. As just one example, the stability of a tablet mounting system's foundation may affect the amount of tolerable force imbalance. For example, in some cases a desktop stand with a base having a large footprint, or a stand system that is fixedly attached to a sturdy support object such as a wall, may be able to tolerate larger force imbalances without a concern about the tablet mounting system tipping over or falling down. Accordingly, the size of a base or the strength of attachment between stand and support object may be varied to accommodate various force imbalances within a tablet mounting system.

According to some embodiments, a monitor brace can also help stabilize a tablet mounting system. Examples of a monitor brace 150 are illustrated in embodiments throughout several figures, including in FIGS. 2B, 3A, 3B, 7A, 7B, 8, and 11. In general, the monitor brace 150 can provide additional support to a support arm when the brace is in contact with the frame of a display monitor. In some cases the monitor brace can function to reduce or eliminate the net rotational force acting on a tablet mounting system by providing a counteracting force, which can help to stabilize the tablet mounting system.

In some embodiments, a monitor brace can be slidably (or otherwise translatably) attached to an extension arm portion of a support arm, as described above, such that the monitor brace can be moved along at least a portion of the extension arm. In some embodiments, the movement of the monitor brace relative to the extension arm can be regulated through the use of a spring element. In some embodiments, the monitor brace can have a releasable fastener that engages with the extension arm. The releasable fastener can be a thumb screw, a compression fastener, or any other fastening device that can selectably fix the position of the monitor brace with respect to the extension arm, in a plurality of positions, and selectably release the monitor brace, such that the monitor brace can again be moved relative to the extension arm. In some embodiments, a friction device, such as a rubber or silicone collar, can be used to position the monitor brace. In some embodiments, a releasable fastener that is used to engage the support arm with the extension arm can also be used to engage the monitor brace with the extension arm.

In some embodiments, the monitor brace can be attached to a projection arm portion of a support arm, which can have certain advantages over attaching the monitor brace to the extension arm. For example, attaching the monitor brace to the projection arm allows the extension arm to be moved relative to the projection arm, without changing the location of the brace relative to the projection arm. This can result in the brace remaining in contact with an attached monitor (and thus still providing support to the mounting system), while permitting the extension arm to travel and move an attached tablet closer to, or further from, the monitor. According to some embodiments, a monitor brace can be attached to a projection arm in a manner similar to the way it can be attached to the extension arm. For example, a monitor brace can be slidably (or otherwise translatably) attached to the projection arm, such that the monitor brace can be moved along at least a portion of the projection arm.

While the above examples of a monitor brace are described with respect to an extensible support arm, in some cases a brace can be used with a support arm that is fixed in length, such as the arm 114 depicted in FIG. 2A. The monitor brace can be attached to the fixed length support arm in a manner similar to attaching a monitor brace to an extension arm. In these embodiments, the monitor brace can be slidably (or otherwise translatably) attached to the support arm, such that the monitor brace can also be moved along at least a portion of the support arm in order to accommodate a tablet support system being used with display monitors of various widths.

A monitor brace can have any shape useful for bracing against the side, or frame, of a display monitor, while remaining attached to an arm of a tablet mounting system. As can be seen from FIG. 3B, the monitor brace 150 has a generally "L" shaped profile, and as can be seen from FIG. 7B, the brace 150 can be adjustable in order to accommodate monitors of varying thicknesses. In some embodiments, the brace can have a "C" or "Z" shaped profile, and can optionally be provided with padding, which can improve the fit of a monitor brace against the edge of display monitors from a variety of manufacturers.

Various possible details about the configuration of a monitor portion, the configuration of a tablet portion, and the configuration of a support portion of a tablet support arm will now be described.

According to some embodiments, the monitor portion, the tablet portion, and the support portion of a tablet support arm can each be of any shape useful for attaching to and/or otherwise supporting the display monitor, the tablet, and the support object, respectively. For example, a portion of a support arm may have a configuration including one or more brackets, mounts, tilts, pivots, fasteners, and other structural aspects and/or hardware components that are useful for fixedly or removably attaching, mounting, or supporting a display monitor, a tablet, and/or a support object.

Returning to FIG. 3A, an embodiment of a support arm 105 is illustrated that includes a monitor portion 116 having four display monitor mounting holes 152 located in a VESA (Video Electronics Standards Association) compliant support arrangement. The four mounting holes 152 are provided so that the monitor portion 116 can be attached to display mounts or other mounting provisions that include VESA compliant arrangements typically used in conjunction with display monitors. Similarly, the tablet portion 118 can be of any configuration and/or shape useful for attaching to a tablet mount (e.g., a tablet docking station) as will be described in greater detail below. For example, in the illustrated embodiment the tablet portion 118 can include a mounting bracket 124 with four mounting holes 158 located in a VESA compliant arrangement. Finally, the support portion 120 is also shown with four mounting holes 160 which are also located in a VESA compliant arrangement in this example. The four mounting holes 160 are provided so that the support portion 120 can be attached to mounting provisions typically found on external monitor stands and/or articulating arms, which often include VESA compliant arrangements.

In some embodiments, the monitor portion, the tablet portion, and/or the support portion can include captive screws, captive screw assemblies, quarter-turn or half-turn fasteners, quick release mechanisms and/or any other fastening device that would simplify the attachments. In addition, it should be appreciated that while VESA interface configurations are popular, a wide variety of fastener configurations may be used and embodiments are not limited to any particular configuration or standard. Further, in some embodiments, the shape and/or hole pattern provided by a monitor portion, a tablet portion, and/or a support portion may not be compatible with a respective device (e.g., a tablet mount, a display monitor, and/or a support object). In such situations, attachments may be accomplished through a mounting adaptor. Mounting adaptors can have two mounting patterns, such that otherwise incompatible mounting patterns can nevertheless be attached.

According to some embodiments, varying amounts of overlap may exist between the monitor portion of a support arm and the support portion of a support arm. In the example shown in FIG. 3A, the four display monitor mounting holes 152 are shown in an overlapping arrangement with the four mounting holes 160 of the support portion 120. In this arrangement, the support portion 120 overlaps with the monitor portion 116 and the center of the four display monitor mounting holes 152 is located to the left of the center of the support portion mounting holes 160 as viewed in FIG. 3A. The outcome of this arrangement is that a display monitor mounted to the monitor portion 116 will have a center of mass to the left of the center of the support portion mounting holes 160 (as viewed in FIG. 3A), which will result in a second rotational force to counterbalance the rotational force generated by the supported tablet as described above.

In some cases there may be no overlap between the support portion and the monitor portion on a tablet support arm. This is the case in the examples depicted in FIGS. 2A, 4, and 6, in which the support portion 120 and the monitor portion 116 do not overlap. In some cases, the support portion may partially overlap the monitor portion, such as in the example shown in FIGS. 3A-3B. In some cases, the support portion and the monitor portion may fully overlap or be co-located on the support arm. In the embodiments depicted in FIGS. 2B and 2C, for example, the monitor portion 116 and the support portion 120 are both located at the right hand side of the projection arm 110 as viewed in the figures. In these embodiments, four display monitor mounting holes 152 are used to support the monitor 102. The display monitor mounting holes 152 are co-located with four support portion mounting holes 160. Thus in these configurations, through fasteners can be used to attach both an external monitor stand and the display monitor to the tablet mounting system using the same set of mounting holes. Of course other configurations of co-located monitor portions and support portions can also be contemplated that do not include co-locating mounting holes.

FIGS. 7A and 7B depict an additional embodiment of a tablet mounting system illustrating some aspects of a support arm tablet portion 118. FIG. 7A depicts a front perspective view of the tablet portion 118 of a tablet mounting system. The tablet portion 118 includes a mounting bracket 124. In some cases the mounting bracket is attached to the extension arm such that the mounting bracket provides a tilt mechanism and/or a pivot mechanism. Accordingly, in the embodiment depicted in FIGS. 7A and 7B, the tablet mounting system is configured so that an attached tablet can be tilted and pivoted, which can improve user comfort while viewing and/or using a mounted tablet. Any appropriate fitting that is useful to permit simultaneous and/or sequential panning and tilting can be used, such as a ball and socket joint, or a pair of clevis brackets and pins used in tandem. As shown in FIGS. 7A and 7B, a clevis bracket 154 can be attached to either an extension arm 112, or to a support arm 114. A clevis pin 156 provides a first axis of rotation (in this case, in a pivotal orientation). A second clevis bracket can be formed from the mounting bracket 124, with a second clevis pin 162 providing a second axis of rotation (in this case, in a tilting orientation). Thus, a tablet mounting system can permit a tablet to be panned and tilted in a manner that is independent of any pan or tilt adjustment that may be made to an attached display monitor.

In some embodiments, the force that is required to tilt and/or pivot a mounting bracket can be adjusted. In some embodiments this can be accomplished through tightening the clevis pins, which can be threaded fasteners. In some embodiments, adjusting the force required to tilt and/or pivot a mounting bracket can be accomplished through tightening additional fasteners, levers, or other components as may be appreciated.

According to some embodiments, the mounting bracket can be provided with a releasable fastener that may include, for example, a quick release mechanism (not shown). A releasable fastener and/or quick release mechanism can be useful in cases in which a user may wish to frequently connect and disconnect multiple tablet mounts and supported tablets from the same support arm. Such embodiments can be useful when a first tablet mount configuration is adapted to support a first tablet, and a second tablet mount configuration is adapted to support a second tablet where the first tablet is not compatible with the second tablet mount configuration, and the second tablet is not compatible with the first tablet mount configuration. Using a quick release mechanism, a user can substitute the first for the second tablet mount configuration in order to support a second tablet in lieu of a first tablet.

FIG. 8 depicts a rear perspective view of a tablet 106, in a landscape orientation, supported by a tablet mounting system similar to the system depicted in FIGS. 7A-7B. FIG. 9 depicts a rear perspective view of the tablet 106 in FIG. 8, in a portrait orientation, supported by the tablet mounting system. As can be seen, a tablet portion 118 may provide rotation so that the mounting bracket 124 and a supported tablet can be rotated. For example, in some cases the tablet portion 118 may provide rotation between landscape and portrait orientations.

FIG. 8 shows a tablet mount 149 attached to mounting bracket 124. The mounting bracket 124 is attached to the tablet portion 118 of an extension arm 112 of support arm 114 and the dashed lines depict a hidden rotation or detent mechanism within the support arm according to some embodiments. A spring 164 is attached to a slider 166 at one end and to the structure of the arm 112, 114 at the other end. The slider 166 houses a rotating catch 172 that is attached to mounting bracket 124 and that is permitted to rotate within an opening of the slider 166. Thus, the rotating catch 172 is coupled to rotate in conjunction with the mounting bracket 124, and thus the tablet mount 149. In FIG. 8, the tablet 106 and the tablet mount 149 are rotated in a landscape orientation. As a result, the rotating catch 172 has been accordingly rotated and is seated within the landscape detent feature 174.

If a user wishes to change the orientation of the tablet 106 from landscape, as shown in FIG. 8, to portrait, the user would first move the tablet to the left (as viewed in FIG. 8) against the urging of spring 164. Moving the tablet to the left causes the slider 166 as well as the rotating catch to move to the left, which is in a direction that is in opposition to the urging of spring 164. The user can then rotate the tablet to a portrait orientation, which will cause the rotating catch 172 to also rotate within the slider 166. As the user releases the tablet, the spring 164 will urge the rotating catch 172 to seat within the portrait detent feature 176. As a result of the detent mechanism, the tablet is only permitted to rotate in 90 degree increments once released by a user. Accordingly, the detent mechanism provides at least two biased tablet orientations that include a tablet portrait orientation and a tablet landscape orientation.

As shown and referred to in FIGS. 7B, 8, and 9, in some cases the tablet portion of a support arm includes and/or is attached to a tablet mount 149. In broad terms, a tablet mount generally includes one or more components that are configured to provide an interface between the tablet mounting system (e.g., a support arm, an extension arm, a tablet portion of an arm, etc.) and the tablet. Accordingly, a tablet mount can be configured to attach to or otherwise be supported by the tablet portion of a support arm. To support a tablet, a tablet mount may be configured to receive and retain or secure the tablet with one or more movable or deformable components. In some cases the tablet mount may be configured to attach the tablet to the body of a tablet, or may otherwise support and/or retain a tablet.

As will be appreciated, multiple configurations are available for a tablet mount to support a tablet. As depicted in FIG. 1, the tablet mount 148 can have a base portion 190 and a movable clip portion 192. The base portion 190 can have a lip 188 and side rails 194 that function to retain the tablet 106. In some embodiments, the side rails work in conjunction with the movable clip portion 192 to releasably retain the tablet 106 within the tablet mount 148. In some embodiments, the base portion 190 may have side rails that are configured to retain the tablet 106 without a movable clip portion. Embodiments without a movable clip portion may securely (e.g., releasably) retain a tablet by, for example, having side rails that extend further upwards to support the tablet 106. Some embodiments without a movable clip portion can make use of snug-fitting side rails that secure a tablet by reducing the relative motion of a tablet within the tablet mount. Some embodiments without a movable clip portion may make use of a tablet connector to assist in securing a tablet within the mount. For example, the base portion 190 may have an aperture aligned with one or more ports on the tablet that allows a tablet connector to connect to the tablet port(s) through the base portion 190. Once connected, the tablet connector may retain the tablet port, and thus the tablet, proximate the base portion.

In the example depicted in FIG. 2A, a tablet mount 148 can have a mount body 196 to releasably retain a tablet 106. Mount body 196 can include snap-fit retention clips (not shown) at the top and/or the bottom of the mount body 196. Snap-fit retention clips can be made from any elastically deflectable or deformable material, which can include various plastics and metals. The clips can be configured to deform slightly when retaining the tablet 106, which can assist in positively retaining the tablet 106 within the tablet mount 148. In some cases using metal retention clips, the clips can optionally receive a non-galling or non-marring surface treatment to reduce the likelihood that the clips will scratch a retained tablet.

Turning to FIG. 2B, in some cases a tablet mount 148 can include a movable clip 192 with a spring activated hinge 198. The spring activated hinge can urge the movable clip 192 downward to positively engage and releasably retain the tablet 106 in the mount 148. Other embodiments can employ a movable clip that is formed from a flexible material, such as metals or plastics, which can be configured to deflect upwards in a spring-like manner in order to permit a tablet to be inserted into the tablet mount, after which the material may then spring back downward to positively retain the tablet 106.

According to some embodiments, a tablet mount may also be a tablet docking station. As used herein, a tablet "docking station" refers to a type of a tablet mount that is configured to support a tablet, but that also provides connectivity options for the tablet. For example, in some cases a docking station can additionally provide a connector for connecting the docking station to a port on the tablet. The docking station can be configured to align a tablet, as the tablet is positioned into the docking station, such that a port in the tablet aligns with, and connects to, a corresponding connector in the docking station. FIGS. 7B, 8, and 9 illustrate one example of a tablet mount 149 configured as a docking station. Although not shown, the docking station includes a connector (e.g., mounted in a bottom edge surface of the mount) that connects to the tablet 106 to provide the tablet with power and other desirable connectivity. Some examples of other tablet mounts, including tablet docking stations, which can be compatible with embodiments of tablet mounting systems disclosed herein, can be found in U.S. patent application Ser. No. 13/651,066, and entitled Tablet Mounting Systems, Stands And Methods, and U.S. patent application Ser. No. 13/650,631, and entitled Tablet Mounting Systems and Methods, both applications which are filed concurrently herewith on Oct. 12, 2012, and the contents of each of which are hereby incorporated by reference.

As discussed elsewhere above, the support portion of a tablet support arm can be configured to attach to a wide variety support objects, thus providing embodiments of a tablet mounting system with the ability to be used in many environments. Several possible embodiments illustrating different types of support objects and/or structural elements within a tablet mounting system will now be discussed with reference to FIGS. 10-13D.

As depicted in FIG. 10, a tablet mounting system 115 can be supported by a laptop stand 210. Exemplary embodiments of laptop or notebook stands are described in US Patent Publication No. 2007/259,554, titled Stand System and Method, the contents of which are hereby incorporated by reference. Returning to FIG. 10, the laptop 212 is open, so that the laptop display 214 can be viewed by a user. In this embodiment, the support portion of the tablet mounting system 115 is configured to be attached to the laptop stand 210. As depicted, the tablet 106 is positioned in a portrait orientation and is situated lower than the laptop display 214. In addition, the tablet 106 is tilted further backwards than the laptop display 214. Such positioning can be ergonomically advantageous for a user who desires to interact with the tablet's touch screen display. An external keyboard and a mouse can also be used in the embodiment shown, which can further enhance the usability of the laptop and tablet devices. As depicted, the tablet can function as an external monitor for the laptop, or the tablet can function as an independent computing device, which of course can be linked to a network, or to the laptop.

Figure 11:
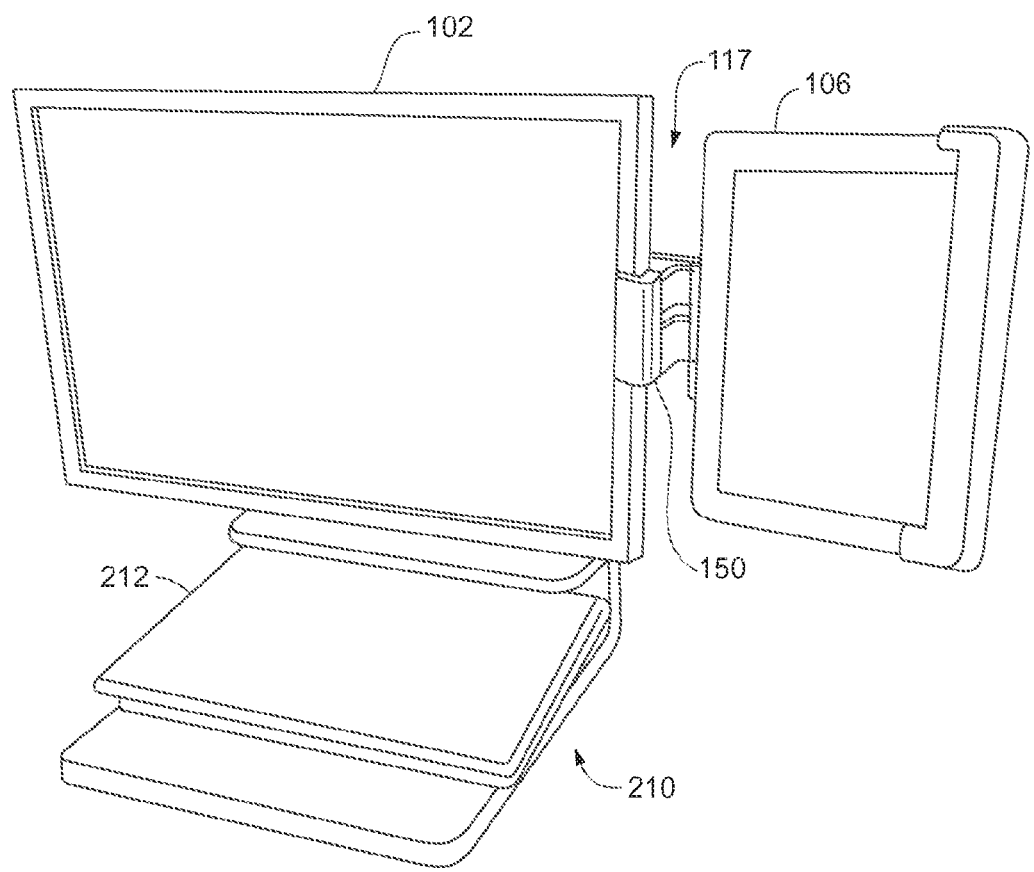
FIG. 11 is a front perspective view of a tablet mounting system attached to a display monitor, in accordance with an embodiment.

As depicted in FIG. 11, a tablet mounting system 117 can be used with a display monitor 102 that is utilized as part of a laptop stand 210. In this embodiment, the support portion of the tablet mounting system 117 is configured to be attached to the external monitor stand, and a monitor brace 150 is used to help the tablet mounting system 117 support the weight of the tablet. The tablet 106 is positioned in a portrait orientation that is substantially level with the display monitor 102. Such positioning can be ergonomically advantageous for a user who desires to view the tablet's screen. As depicted, the tablet can function as a second external monitor for the laptop, or the tablet can function as an independent computing device, which of course can be linked to a network, or to the laptop. Alternatively, the tablet itself can act as the driver for the images displayed on both the display monitor as well as the tablet's screen.

Figure 12:
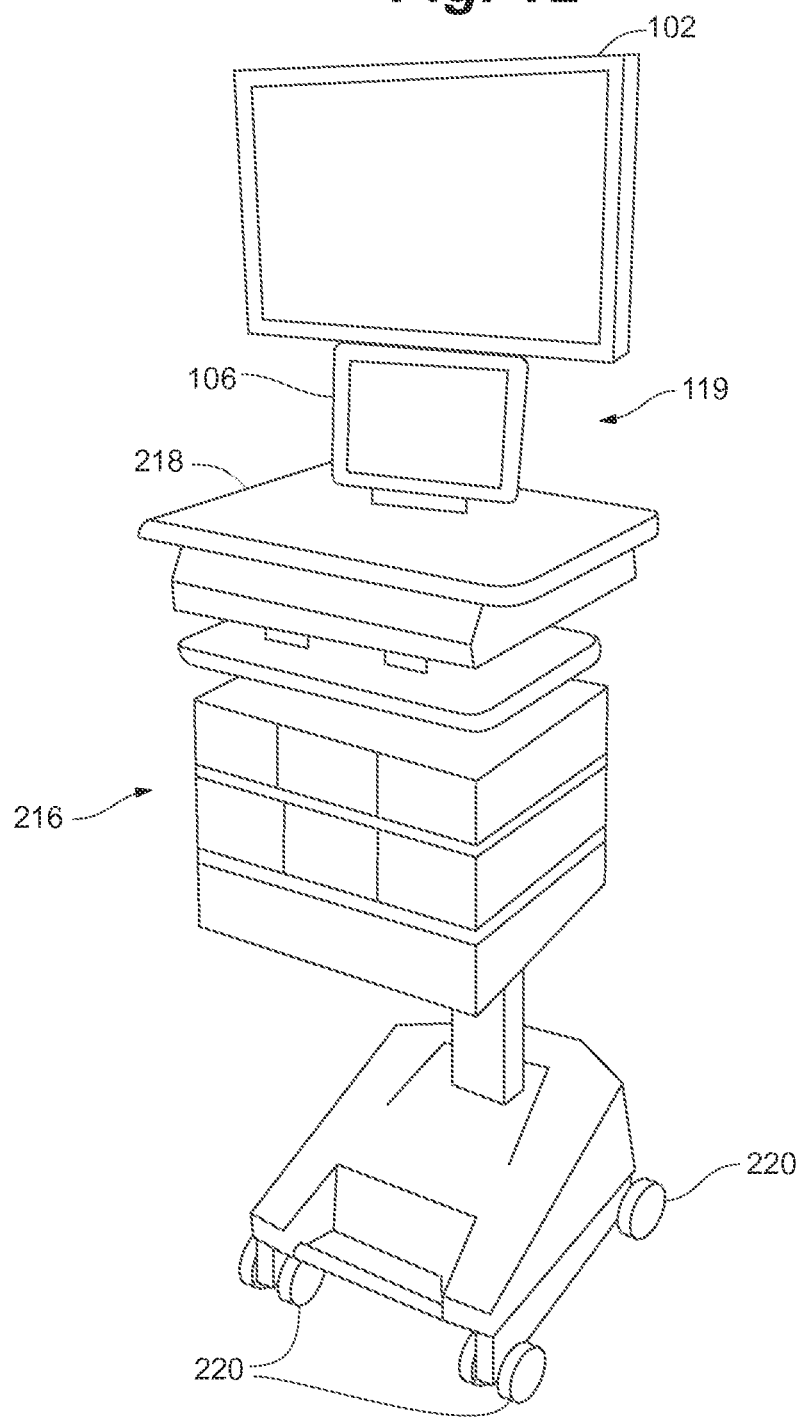
FIG. 12 is a front perspective view of a tablet mounting system attached to a work cart, in accordance with an embodiment.

Another embodiment of a tablet mounting system 119 is depicted in FIG. 12. In some cases, embodiments can be provided with a work cart 216. The work cart 216 can be provided from a variety of suitable types of work carts used in various mobile applications such as medical services, or as mobile airline check-in kiosks, for example. According to some embodiments, the support portion of the tablet mounting system 119 is configured to attach to a cart 216 structure. The tablet can function as the driver for the images displayed on both the display monitor as well as the tablet's screen, and the tablet can be wirelessly connected to a network. As depicted, a tablet 106 is positioned by the tablet mounting system 119 below a display monitor 102 and above a work surface 218. Such positioning can be advantageous, as the tablet is supported such that a user can interact with the tablet's touch screen, while at the same time leaving the work surface 218 free for other uses. Consequently, compared to a work cart which utilizes a laptop, the depicted work cart can provide the same work space in a much smaller cart footprint. The work cart 216 can also be provided with wheels 220 so that the cart can move across a floor surface.

As depicted in FIG. 13A, in some cases a tablet mounting system 121 can be used with an apparatus 222 for positioning a display monitor and keyboard. In these embodiments, an apparatus arm 224 supports a column 226 and a keyboard tray 228. The support portion of the tablet mounting system 121 is configured to be supported by the column 226, the monitor portion supports a display monitor 102, and the tablet portion supports a tablet 106. As depicted, the tablet can function as the driver for the images displayed on both the display monitor as well as the tablet's screen, and the keyboard and mouse can be used to facilitate input by a user. The apparatus arm 224 permits a user to position all of the equipment at a desired position. According to some embodiments, the apparatus arm 224 can be provided as part of a desk clamp arm. Arms useful in this arrangement include the support arms disclosed in U.S. Pat. No. 7,252,277, assigned to Ergotron, Inc., and hereby incorporated by reference.

FIG. 13B illustrates an embodiment in which a tablet mounting system 123 can be used with a wall-mounted display 102. The support portion of the tablet mounting system 123 is configured to be supported by the wall 131, the monitor portion supports a display monitor 102, and the tablet portion supports a tablet 106. A keyboard tray 228 is also mounted to the wall 131, which can releasably retain a keyboard and mouse. This embodiment can be advantageous, as a very thin profile can be achieved when not in use. For example, the keyboard tray can be folded up, and the monitor and tablet can be recessed against the wall. Wall mounts useful in this arrangement include the lift systems disclosed in U.S. Pat. No. 6,189,849, assigned to Ergotron, Inc., and hereby incorporated by reference.

As depicted in FIG. 13C, a tablet mounting system 125 can be used with a desk clamp 138. As depicted, the desk clamp 138 includes a clamp 140 which is used to attach the desk clamp 138 to a desk 130 or other horizontal surface. The desk clamp 138 also includes a vertical portion 142, a pivotal portion 144 and a vertical riser 146. The support portion of the tablet mounting system 125 is attached to the vertical riser 146. The monitor portion is attached to and supports the display monitor 102, and the tablet portion is attached to and supports a tablet 106.

FIG. 13D depicts another embodiment of a tablet mounting system 125 including a work cart 230. In these embodiments, the support portion of the tablet mounting system 125 is configured to attach to a cart 230 structure. The tablet can function as the driver for the images displayed on both the display monitor as well as the tablet's screen, and the tablet can be wirelessly connected to a network. As depicted, a tablet 106 is positioned by the tablet mounting system 119 to the right of a display monitor 102 and above a work surface 218 as shown in the figure. Such positioning can be advantageous, as the tablet is supported such that a user can interact with the tablet's touch screen, while at the same time leaving the work surface 218 free for other uses. A keyboard tray 228 is also mounted to the cart 230 permitting a keyboard and mouse to be used, which can facilitate input by a user. The work cart 230 can also be provided with wheels 220 so that the cart can move across a floor surface.

Some embodiments also provide methods for mounting a tablet with a tablet mounting system. In some cases such a method can include first providing a tablet and a support arm. In some cases the support arm has a first end and a second end and at least includes a tablet portion located near the first end of the support arm for supporting the tablet. The support arm includes a monitor portion located between the tablet portion and the second end of the support arm for supporting a display monitor. In some cases the support portion is located between the first end and the second end of the support arm, and the support portion is configured to attach to a support object, such as one of those described above. In some cases, the support portion is located closer to the monitor portion of the support arm than to the tablet portion of the support arm. The method can also include attaching a tablet mount configured to support a tablet to the tablet portion of the support arm. Further, the method may also include supporting the tablet with the tablet mount.

According to some embodiments, a method for mounting a tablet may also include attaching a monitor mount to the monitor portion of the support arm and supporting a display monitor with the monitor mount. Methods may further include attaching the support arm to a support object, which may, for example, include a laptop stand, a desktop display monitor stand, a wall mount, a computer cart, or an articulating arm support, among other support objects.

Thus, some embodiments of the invention are disclosed. Although the invention has been described in considerable detail with reference to certain disclosed embodiments, the disclosed embodiments are presented for purposes of illustration and not limitation and other embodiments of the invention are possible. One skilled in the art will appreciate that various changes, adaptations, and modifications may be made without departing from the spirit of the invention and the scope of the appended claims.

What is claimed is:

1. A tablet mounting system comprising:
a support arm having a first end and a second end, the support arm comprising
a projection arm having a first end and a second end;
an extension arm having a first end and a second end, the projection arm and the extension arm interconnected such that the extension arm is longitudinally movable relative to the projection arm to extend and retract between a fully extended position and a fully retracted position, the projection arm being interconnected near the first end of the projection arm, and the extension arm being interconnected near the second end of the extension arm;
a tablet portion located near the first end of the extension arm for supporting a tablet,
a monitor portion located between the tablet portion and the second end of the projection arm for supporting a display monitor, and
a support portion located between the first end and the second end of the projection arm, the support portion configured to attach to a support object, the support portion located closer to the monitor portion of the support arm than to the tablet portion of the support arm;
a tablet mount configured to support a tablet and to ach to the tablet portion of the support arm; and
a brace attachable to the extension arm and located between the first end and the second end of the extension arm, the brace configured to translate in a longitudinal direction relative to a length of the extension arm, the brace including:
a first portion and a second portion, the first portion configured to extend from the extension arm and the first portion is configured to extend adjacent an edge of the supported display monitor, the second portion configured to extend from the first portion,
the first portion and the second portion being so configured as to define an adjustable clamping structure, the second portion being so configured as to be adjustable relative to the extension arm so as to contact a front portion of the supported display monitor and clamp the brace about a thickness of the supported display monitor,
wherein in an attached state the support arm is configured to position the tablet mount and a supported tablet relative to the support object.

2. The tablet mounting system of claim 1, wherein the support portion is partially overlapped with the monitor portion.

3. The tablet mounting system of claim 1, wherein the support portion is completely overlapped with the monitor portion.

4. The tablet mounting system of claim 1, wherein the support portion is located between the tablet portion and the monitor portion without overlapping the monitor portion.

5. The tablet mounting system of claim 1, wherein in the attached state a weight of the supported tablet creates a first rotational force based on a distance between the tablet portion and the support portion, and a weight of a supported display monitor creates a second rotational force based on a distance between the monitor portion and the support portion, whereby
   (a) the first rotational force has a direction substantially opposite a direction of the second rotational force, and
   (b) the magnitude of the first rotational force is not substantially greater than twice the magnitude of the second rotational force.

6. The tablet mounting system of claim 1, further comprising a weight beam attached to the support arm, the weight beam supporting a counterweight movable along at least a portion of the length of the weight beam.

7. The tablet mounting system of claim 6 wherein in the attached state a weight of the supported tablet creates a first rotational force based on a distance between the tablet portion and the support portion, a weight of a supported display monitor creates a second rotational force based on a distance between the monitor portion and the support portion, and a weight of the counterweight creates a third rotational force based on a distance between the counterweight and the support portion, whereby
   (a) the first rotational force has a direction substantially opposite a direction of the second rotational force and substantially opposite a direction of the third rotational force, and
   (b) the magnitude of the first rotational force is not substantially greater than twice the magnitude of the second rotational force combined with the third rotational force.

8. The tablet mounting system of claim 1 wherein the support portion is configured to attach to the support object in a plurality of orientations, whereby the support arm is configured with a corresponding plurality of orientations, wherein
   in a first of the plurality of support arm orientations, the supported tablet is located to the right of a supported display monitor, in a second of the plurality of support arm orientations, the supported tablet is located to the left of a supported display monitor, in a third of the plurality of support arm orientations, the supported tablet is located above a supported display monitor, and in a fourth of the plurality of support arm orientations, the supported tablet is located below a supported display monitor.

9. The tablet mounting system of claim 1, wherein the tablet portion provides rotation of the tablet mount and the supported tablet with respect to the support arm, the rotation including at least two biased tablet orientations comprising a tablet portrait orientation and a tablet landscape orientation.

10. The tablet mounting system of claim 9, wherein the tablet portion further comprises a detent mechanism comprising:
   a slider,
   a rotating catch that is permitted to rotate relative to the slider,
   a landscape detent feature, and
   a portrait detent feature, wherein
      the rotating catch can be seated in one of two features: (i) the landscape detent feature, and (ii) the portrait detent feature; and wherein
      when the rotating catch is seated in the landscape detent feature, the supported tablet is in a landscape orientation, and
      when the rotating catch is seated in the portrait detent feature, the supported tablet is in portrait orientation.

11. The tablet mounting system of claim 1, wherein the tablet portion comprises a VESA support arrangement for attaching the tablet portion to the tablet mount.

12. The tablet mounting system of claim 1, wherein the table mount is configured to releasably retain the supported tablet.

13. The tablet mounting system of claim 1, wherein the tablet mount comprises a tablet docking station.

14. The tablet mounting system of claim 1 wherein the support portion is configured to attach to one or more of a laptop stand, a desktop display monitor stand, a wall mount, a computer cart, and an articulating arm support.

15. A tablet mounting system comprising:
   a projection arm having a first end and a second end, the projection arm comprising
      a monitor portion located near the second end of the projection arm for supporting a display monitor, and
      a support portion located between the first end and the second end of the projection arm, the support portion configured to attach to a support object;
   an extension arm having a first end and a second end, the extension arm comprising a tablet portion located near the first end of the extension arm, the tablet portion configured to support a tablet; and
   a brace attachable to the extension arm and located between the first end and the second end of the extension arm, the brace configured to engage with only one edge of the supported display monitor and configured to translate in a longitudinal direction relative to a length of the extension arm, the brace including:
      a first portion and a second portion, the first portion configured to extend from the extension arm and the first portion is configured to extend adjacent an edge of the supported display monitor, the second portion configured to extend from the first portion,
      the first portion and the second portion being so configured as to define an adjustable clamping structure, the second portion being so configured as to be adjustable relative to the extension arm no as to contact a front portion of the supported display monitor and clamp the brace about a thickness of the supported display monitor,
   wherein the projection arm and the extension arm are interconnected to form an extensible arm assembly, wherein the extension arm is longitudinally movable relative to the projection arm to extend and retract between a fully extended position and a fully retracted position, and wherein the projection arm is interconnected near the first end of the projection arm and the extension arm is interconnected near the second end of the extension arm.

16. The tablet mounting system of claim 15, further comprising a tablet mount configured to attach to the tablet portion of the extension arm and support a tablet.

17. The tablet mounting system of claim 16, wherein the tablet mount is configured to releasably retain a supported tablet.

18. The tablet mounting system of claim 15, wherein the support portion is at least partially overlapped with the monitor portion.

19. The tablet mounting system of claim 15, wherein the tablet portion provides rotation of a tablet mount and a supported tablet, the rotation including at least two biased tablet orientations comprising a tablet portrait orientation and a tablet landscape orientation.

* * * * *

UNITED STATES PATENT AND TRADEMARK OFFICE
CERTIFICATE OF CORRECTION

PATENT NO. : 9,441,782 B2  
APPLICATION NO. : 13/650702  
DATED : September 13, 2016  
INVENTOR(S) : Funk et al.

Page 1 of 1

It is certified that error appears in the above-identified patent and that said Letters Patent is hereby corrected as shown below:

On the Title Page

In item (72), in "Inventors", in Column 1, Line 1, delete "Rosemount," and insert --St. Paul,--, therefor In the Specification In Column 8, Line 10, delete "position" and insert --portion--, therefor In Column 8, Line 39, delete "extensible" and insert --extension--, therefor In the Claims In Column 18, Line 40, in Claim 1, delete "ach" and insert --attach--, therefor In Column 19, Line 14, in Claim 5, delete "(b)the" and insert --(b) the--, therefor In Column 19, Line 21, in Claim 7, after "claim 6", insert --,--, therefor In Column 19, Line 39, in Claim 8, after "claim 1", insert --,--, therefor In Column 20, Line 10, in Claim 10, before "portrait", insert --a--, therefor In Column 20, Line 15, in Claim 12, delete "table" and insert --tablet--, therefor In Column 20, Line 19, in Claim 14, after "claim 1", insert --,--, therefor In Column 20, Line 49, in Claim 15, delete "no" and insert --so--, therefor Signed and Sealed this  
Thirteenth Day of March, 2018

Andrei Iancu  
*Director of the United States Patent and Trademark Office*